US010353289B2

(12) United States Patent
Murakami et al.

(10) Patent No.: US 10,353,289 B2
(45) Date of Patent: Jul. 16, 2019

(54) METHOD FOR FORMING RESIN CURED FILM PATTERN, PHOTOSENSITIVE RESIN COMPOSITION, PHOTOSENSITIVE ELEMENT, METHOD FOR PRODUCING TOUCH PANEL, AND RESIN CURED FILM

(71) Applicant: HITACHI CHEMICAL COMPANY, LTD., Chiyoda-ku, Tokyo (JP)

(72) Inventors: Yasuharu Murakami, Hitachi (JP); Hiroshi Yamazaki, Hitachi (JP); Yoshimi Igarashi, Hitachi (JP); Naoki Sasahara, Hitachi (JP); Ikuo Mukai, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/062,996

(22) Filed: Mar. 7, 2016

(65) Prior Publication Data
US 2016/0223906 A1  Aug. 4, 2016

Related U.S. Application Data

(63) Continuation of application No. 14/362,726, filed as application No. PCT/JP2012/081383 on Dec. 4, 2012, now Pat. No. 9,348,223.

(30) Foreign Application Priority Data

Dec. 5, 2011  (JP) .................... PCT/JP2011/078104

(51) Int. Cl.
*G03F 7/004*   (2006.01)
*G03F 7/038*   (2006.01)
(Continued)

(52) U.S. Cl.
CPC ............. *G03F 7/038* (2013.01); *C08G 18/00* (2013.01); *G03F 7/0007* (2013.01);
(Continued)

(58) Field of Classification Search
CPC ...... G03F 7/0045; G03F 7/038; G03F 7/0007; G03F 7/031; G03F 7/032; C08G 18/00; G06F 2203/04103
(Continued)

(56) References Cited

U.S. PATENT DOCUMENTS 7,534,500 B2 * 5/2009 Kobayashi ........ B29C 45/14811
                                                    200/310
8,168,369 B2   5/2012 Cho et al.
(Continued)

FOREIGN PATENT DOCUMENTS

CN    1500232 A    5/2004
CN    1580953 A    2/2005
(Continued)

OTHER PUBLICATIONS

Machine translation of WO 2011/129312 (no date).*
(Continued)

*Primary Examiner* — Amanda C. Walke
(74) *Attorney, Agent, or Firm* — Fitch, Even, Tabin & Flannery, L.L.P.

(57) ABSTRACT

The method for forming a resin cured film pattern according to the invention comprises a first step in which there is formed on a base material a photosensitive layer composed of a photosensitive resin composition comprising a binder polymer with a carboxyl group having an acid value of 75 mgKOH/g or greater, a photopolymerizable compound and a photopolymerization initiator, and having a thickness of 10 μm or smaller, a second step in which prescribed sections of the photosensitive layer are cured by irradiation with active
(Continued)

light rays, and a third step in which the sections of the photosensitive layer other than the prescribed sections are removed to form a cured film pattern of the prescribed sections of the photosensitive layer, wherein the photosensitive resin composition comprises an oxime ester compound and/or a phosphine oxide compound as the photopolymerization initiator.

8 Claims, 5 Drawing Sheets

(51) Int. Cl.

| | | |
|---|---|---|
| *C08G 18/00* | (2006.01) | |
| *G03F 7/00* | (2006.01) | |
| *G03F 7/20* | (2006.01) | |
| *G03F 7/32* | (2006.01) | |
| *G06F 3/044* | (2006.01) | |
| *G03F 7/032* | (2006.01) | |

(52) U.S. Cl.
CPC ............ *G03F 7/0045* (2013.01); *G03F 7/032* (2013.01); *G03F 7/20* (2013.01); *G03F 7/32* (2013.01); *G06F 3/044* (2013.01); *G06F 2203/04103* (2013.01)

(58) Field of Classification Search
USPC .................. 430/270.1, 311, 319, 322, 325
See application file for complete search history.

(56) References Cited

U.S. PATENT DOCUMENTS

| | | | |
|---|---|---|---|
| 8,198,008 B2 | 6/2012 | Miyasaka et al. | |
| 8,486,591 B2 | 7/2013 | Jeong et al. | |
| 8,871,430 B2 | 10/2014 | Cho et al. | |
| 9,052,587 B2 | 6/2015 | Yamazaki et al. | |
| 9,164,642 B2 * | 10/2015 | Fujii | G06F 3/045 |
| 2007/0099115 A1 | 5/2007 | Umemoto | |
| 2007/0166642 A1 | 7/2007 | Inoue | |
| 2008/0180503 A1* | 7/2008 | Umebayashi | C09D 11/101 347/102 |
| 2008/0268374 A1 | 10/2008 | Tashiro et al. | |
| 2009/0096759 A1 | 4/2009 | Nishiwaki et al. | |
| 2009/0262095 A1 | 10/2009 | Kinoshita et al. | |
| 2010/0249262 A1* | 9/2010 | Sawamoto | C07C 251/62 522/53 |
| 2010/0261815 A1 | 10/2010 | Cho et al. | |
| 2013/0188270 A1 | 7/2013 | Nishimae et al. | |
| 2014/0008115 A1 | 1/2014 | Sato et al. | |

FOREIGN PATENT DOCUMENTS

| | | |
|---|---|---|
| CN | 1707358 | 12/2005 |
| CN | 1707385 A | 12/2005 |
| CN | 1828411 A | 9/2006 |
| CN | 1940724 A | 4/2007 |
| CN | 1945430 A | 4/2007 |
| CN | 101114124 A | 1/2008 |
| CN | 101185028 A | 5/2008 |
| CN | 101384961 A | 3/2009 |
| CN | 101401039 A | 4/2009 |
| CN | 101438208 A | 5/2009 |
| CN | 101546119 A | 9/2009 |
| CN | 101609256 A | 12/2009 |
| CN | 101639627 A | 2/2010 |
| CN | 101805281 A | 8/2010 |
| CN | 101918397 A | 12/2010 |
| CN | 102012634 A | 4/2011 |
| CN | 102096532 A | 6/2011 |
| CN | 102124529 A | 7/2011 |
| CN | 102214024 A | 10/2011 |
| CN | 102576581 A | 7/2012 |
| CN | 102576582 A | 7/2012 |
| EP | 2 450 915 A1 | 5/2012 |
| JP | 63-113585 A † | 5/1988 |
| JP | S63-113585 A | 5/1988 |
| JP | 3-281622 | 12/1991 |
| JP | H06-306145 A | 11/1994 |
| JP | H07-159998 A | 6/1995 |
| JP | 7-253666 | 10/1995 |
| JP | 10-105335 | 4/1998 |
| JP | 11-133617 | 5/1999 |
| JP | 2001162757 A | 6/2001 |
| JP | 2003-248319 A | 9/2003 |
| JP | 2003-345015 A | 12/2003 |
| JP | 2005-039097 A | 2/2005 |
| JP | 2005-099277 A | 4/2005 |
| JP | 2005-099647 | 4/2005 |
| JP | 2005-326507 A † | 11/2005 |
| JP | 2006-23716 | 1/2006 |
| JP | 2006-65073 A | 3/2006 |
| JP | 2006-85053 A | 3/2006 |
| JP | 2006-221099 A | 8/2006 |
| JP | 2006-243464 A | 9/2006 |
| JP | 2006-350297 A † | 12/2006 |
| JP | 2007-86565 A | 4/2007 |
| JP | 2007-100074 | 4/2007 |
| JP | 2007-257963 A | 10/2007 |
| JP | 2008-77067 A | 4/2008 |
| JP | 2008127545 A | 6/2008 |
| JP | 2008-165222 | 7/2008 |
| JP | 2008-233778 A | 10/2008 |
| JP | 2009-048170 A | 3/2009 |
| JP | 2009-048187 A | 3/2009 |
| JP | 2009-073022 A | 4/2009 |
| JP | 2009-128759 A | 6/2009 |
| JP | 2009-186838 A | 8/2009 |
| JP | 2011-065393 A † | 9/2009 |
| JP | 2009-258652 A † | 11/2009 |
| JP | 2010-000434 A | 1/2010 |
| JP | 2010-27033 | 2/2010 |
| JP | 2010-027033 A † | 2/2010 |
| JP | 2010-27033 A | 2/2010 |
| JP | 2010-49029 A | 3/2010 |
| JP | 2010-085929 A | 4/2010 |
| JP | 2010-152302 A | 7/2010 |
| JP | 2010-160670 A | 7/2010 |
| JP | 2010-204532 | 9/2010 |
| JP | 2010-237449 A | 10/2010 |
| JP | 2010-237589 A † | 10/2010 |
| JP | 2010-257952 A | 11/2010 |
| JP | 2011-028594 | 2/2011 |
| JP | 2011-39165 | 2/2011 |
| JP | 2011-60146 A | 3/2011 |
| JP | 2011-060146 A † | 3/2011 |
| JP | 2011-065171 A | 3/2011 |
| JP | 2011-65393 A | 3/2011 |
| JP | 2011-65394 A | 3/2011 |
| JP | 2011-065394 A † | 3/2011 |
| JP | 4737348 B2 | 7/2011 |
| JP | 2011-154700 A | 8/2011 |
| JP | 2011-164886 A † | 8/2011 |
| JP | 2011-186208 A | 9/2011 |
| JP | 2011-227136 | 11/2011 |
| JP | 2011-227467 | 11/2011 |
| JP | 2011-232584 A | 11/2011 |
| JP | 2011237736 A | 11/2011 |
| JP | 4968410 B2 | 7/2012 |
| JP | 2012-215837 | 11/2012 |
| JP | 2013-200577 A | 10/2013 |
| JP | 5304968 B1 | 10/2013 |
| JP | 5304971 B1 | 10/2013 |
| JP | 2013-238837 | 11/2013 |
| KR | 10-2002-0091211 A | 12/2002 |
| KR | 10-2004-0086310 | 10/2004 |
| KR | 10-2007-0031457 A | 3/2007 |
| KR | 10-2007-0073788 | 7/2007 |
| KR | 10-2009-0049541 A | 5/2009 |
| KR | 10-2009-0101848 A | 9/2009 |
| KR | 10-2009-0132499 A | 12/2009 |
| KR | 10-2011-0002609 | 1/2011 |

(56) References Cited

FOREIGN PATENT DOCUMENTS

| | | |
|---|---|---|
| KR | 10-2011-0054369 | 5/2011 |
| KR | 10-2011-0108268 A | 10/2011 |
| KR | 10-2012-0036870 | 4/2012 |
| KR | 10-2012-0052408 | 5/2012 |
| TW | 200725176 A | 7/2007 |
| TW | 200949442 A | 12/2009 |
| TW | 201005436 A | 2/2010 |
| TW | 201027249 A | 7/2010 |
| TW | 201033731 A | 9/2010 |
| TW | 201039053 | 11/2010 |
| TW | I333499 | 11/2010 |
| TW | 201042373 | 12/2010 |
| TW | 201100960 A | 1/2011 |
| TW | 201142506 A1 | 12/2011 |
| TW | 201211677 A | 3/2012 |
| TW | 201214033 A | 4/2012 |
| TW | 201337677 A | 9/2013 |
| TW | I512399 B | 12/2015 |
| WO | 2011/001961 A1 | 1/2011 |
| WO | 2011/046076 A1 | 4/2011 |
| WO | 2011/129210 | 10/2011 |
| WO | 2011/129210 A † | 10/2011 |
| WO | 2011/129312 | 10/2011 |
| WO | 2011/129312 A1 | 10/2011 |
| WO | WO-2011129312 A1 * | 10/2011 ............. G03F 7/105 |

OTHER PUBLICATIONS

Office Action dated Jan. 21, 2016, for Chinese Application No. 201280059872.4.
Office Action dated Jan. 19, 2016, for Japanese Application No. 2015-081741.
Office Action dated Jan. 14, 2016, for Korean Application No. 10-2014-7016024.
Office Action dated Dec. 28, 2015, for Chinese Application No. 201280059836.8.
Office Action dated Dec. 18, 2015, for Korean Application No. 10-2014-7016028.
Office Action dated Aug. 3, 2015, for Korean Application No. 10-2014-7016029; 5 pages.
Office Action dated Aug. 3, 2015, for Korean Application No. 10-2014-7016027; 6 pages.
Taiwanese Office Action dated May 5, 2015, for Taiwanese Application No. 101145683.
Japanese Office Action dated Jul. 7, 2015, for Japanese Application No. 2013-123511.
TW Office Action of Appln. No. 101145693 dated May 21, 2015.
TW Office Action of Appln. No. 101145692 dated May 5, 2015.
Japanese Office Action for Japanese Patent Application No. 2013-548239 dated Mar. 31, 2015.
Japanese Office Action, Japanese Patent Application No. P2013-123511, dated Jan. 13, 2015.
English language translation of communication dated Oct. 14, 2014, in connection with Japanese Application No. 2013-123511, 7 pages.
Communication dated Oct. 14, 2014, in connection with Japanese Application No. 2013-123511, 6 pages.
Communication dated Feb. 21, 2014, in connection with PCT International Application No. PCT/JP2012/081362, 5 pages.
Communication dated Feb. 25, 2014, in connection with PCT International Application No. PCT/JP2012/081377, 5 pages.
Communication dated Jan. 17, 2012, in connection with PCT International Application No. PCT/JP2011/078107, 1 page.
Communication dated Jan. 17, 2012, in connection with PCT International Application No. PCT/JP2011/078104, 1 page.
Communication dated Jan. 17, 2012, in connection with PCT International Application No. PCT/JP2011/078108, 1 page.
Communication dated Mar. 5, 2013, in connection with PCT International Application No. PCT/JP2012/081377, 1 page.
Communication dated Mar. 5, 2013, in connection with PCT International Application No. PCT/JP2012/081362, 1 page.
Communication dated Mar. 12, 2013, in connection with PCT International Application No. PCT/JP2012/081380, 1 page.
Communication dated Mar. 12, 2013, in connection with PCT International Application No. PCT/JP2012/0813865, 1 page.
Communication dated Mar. 5, 2013, in connection with PCT International Application No. PCT/JP2012/081361, 1 page.
Communication dated Mar. 5, 2013, in connection with PCT International Application No. PCT/JP2012/081383, 1 page.
Communication dated Jun. 19, 2014, in connection with PCT International Application No. PCT/JP2012/081377, 5 pages.
Communication dated Jun. 19, 2014, in connection with PCT International Application No. PCT/JP2012/081362, 5 pages.
Communication dated Jun. 19, 2014, in connection with PCT International Application No. PCT/JP2011/078108, 5 pages.
Communication dated Jun. 19, 2014, in connection with PCT International Application No. PCT/JP2011/078104, 6 pages.
Communication dated Jun. 19, 2014, in connection with PCT International Application No. PCT/JP2011/078107, 5 pages.
Communication dated Jun. 19, 2014, in connection with PCT International Application No. PCT/JP2012/081380, 5 pages.
Communication dated Jun. 19, 2014, in connection with PCT International Application No. PCT/JP2012/081383, 5 pages.
Communication dated Jun. 19, 2014, in connection with PCT International Application No. PCT/JP2012/081365, 5 pages.
Communication dated Jun. 19, 2014, in connection with PCT International Application No. PCT/JP2012/081361, 6 pages.
Communication dated Mar. 12, 2013, in connection with PCT International Application No. PCT/JP2012/081365, 1 page.
Office Action dated Feb. 25, 2016, for Taiwanese Application No. 101145696.
Office Action dated Mar. 22, 2016, for Chinese Application No. 201280059906.X.
Office Action dated Mar. 28, 2016, for counterpart Taiwanese Application No. 104133673.
Office Action dated Apr. 19, 2016, for counterpart Korean Application No. 10-2014-7016026.
Office Action dated Apr. 26, 2016, for Taiwanese Application No. 104125481.
Office Action dated Jan. 29, 2016, for Chinese Application No. 201280059838.7.
Office Action dated Feb. 3, 2016, for Chinese Application No. 201280059909.3.
Office Action dated Jul. 15, 2016, for Chinese Application No. 201280059906.X.
Office Action dated Aug. 30, 2016, for Japanese Application No. 2015-081741.
Office Action dated Sep. 21, 2016, for Chinese Application No. 201280059872.4.
Office Action dated Nov. 2, 2016, for Korean Application No. 10-2014-7016024.
Office Action dated Oct. 8, 2016, for Chinese Application No. 201280059838.7.
Office Action dated Jan. 10, 2017, for U.S. Appl. No. 14/362,716, 9 pages.
Office Action dated Jan. 6, 2017, for Taiwanese Application No. 104139042.
Office Action dated Dec. 30, 2016, for Taiwanese Application No. 104138855.
Office Action dated Jun. 8, 2016, for Taiwanese Application No. 104135790.
Office Action dated Jun. 13, 2016, for Taiwanese Application No. 104138855.
Office Action dated Jun. 17, 2016, for Korean Application No. 10-2014-7016025.
Office Action dated Jun. 17, 2016, for Korean Application No. 10-2014-7016027.
Notification of Information Provision dated Aug. 9, 2016, for Japanese Application No. 2015-081741.
Office Action dated Aug. 12, 2016, for Korean Application No. 10-2014-7016029.
Office Action dated Aug. 16, 2016, for Japanese Application No. 2013-123513.

(56) References Cited

OTHER PUBLICATIONS

Notification of Information Provision dated Apr. 4, 2017, for Japanese Patent Application 2013-123513.
Office Action dated Apr. 11, 2017, for Japanese Patent Application 2013-123513.
"Resist Material/Process Technology", Technical Information Institute, May 27, 1991, pp. 185, 187, and 192, together with English language translation thereof.
Office Action dated Jun. 6, 2017, for Japanese Patent Application No. P2015-081741.
Non-Final Office Action dated Jun. 26, 2017, in U.S. Appl. No. 14/362,716.
Office Action dated Jun. 2, 2017, for Chinese Patent Application No. 201280059909.3.
Takenori Notoya et al., "Benzotriazole-A Corrosion Inhibitor for Copper and Its Alloys", Japan Association of Corrosion Control, Jun. 1, 2008, pp. 1 and 32, together with English language translation thereof.
Communication of Third-party submission under 37 CFR 1.290 dated Jun. 26, 2017, in U.S. Appl. No. 15/239,855.
Office Action dated Aug. 23, 2017, for Taiwanese Patent Application No. 104135790.
Non-Final Office Action in U.S. Appl. No. 14/362,716 dated Nov. 21, 2017.
General Tests, Fats and Fatty Oils Test, 2008.
Final Office Action dated Oct. 24, 2017 for U.S. Appl. No. 15/239,855.

\* cited by examiner
† cited by third party

METHOD FOR FORMING RESIN CURED FILM PATTERN, PHOTOSENSITIVE RESIN COMPOSITION, PHOTOSENSITIVE ELEMENT, METHOD FOR PRODUCING TOUCH PANEL, AND RESIN CURED FILM

CROSS-REFERENCE TO RELATED APPLICATIONS

This application is a continuation of U.S. application Ser. No. 14/362,726 filed on Jun. 4, 2014, which is a U.S. national phase application filed under U.S.C. § 371 of International Application No. PCT/JP2012/081383 filed Dec. 4, 2012, designating the United States, which claims priority from International Application No. PCT/JP2011/078104 filed Dec. 5, 2011, the contents of each of which are incorporated herein by reference in their entirety.

TECHNICAL FIELD

The present invention relates to a method for forming a resin cured film pattern, to a photosensitive resin composition, to a photosensitive element, to a method for manufacturing a touch panel and to a resin cured film.

BACKGROUND ART

Liquid crystal display units and touch panels (touch sensors) are used in display devices including large electronic devices such as personal computers and televisions and miniature electronic devices such as car navigation systems, cellular phones and electronic dictionaries or OA•FA devices. Such liquid crystal display units and touch panels are provided with electrodes composed of transparent conductive electrode materials. As transparent conductive electrode materials there are known ITO (Indium-Tin-Oxide), indium oxide and tin oxide, which materials exhibit high visible light transmittance and are therefore the major materials used as electrode materials for liquid crystal display unit boards.

Various types of systems are already being implemented for touch panels, but in recent years the use of electrostatic capacitive touch panels has been progressing. In an electrostatic capacitive touch panel, contact of the fingertip (a conductor) with the touch input screen causes electrostatic capacitive coupling between the fingertip and the conductive film, forming a condenser. Thus, an electrostatic capacitive touch panel detects changes in electrical charge at sites of contact with the fingertip, thereby determining the coordinates.

In particular, projection-type electrostatic capacitive touch panels have satisfactory operativity allowing complex instructions to be carried out since they allow multipoint fingertip detections, and the excellent operativity has led to their utilization as input devices on the display surfaces of devices with small displays such as cellular phones, portable music players and the like.

For representation of two-dimensional coordinates with an X-axis and a Y-axis, a projection-type electrostatic capacitive touch panel generally has a plurality of X-electrodes and a plurality of Y-electrodes perpendicular to the X-electrode forming a two-layer structure, with ITO (Indium-Tin-Oxide) employed as the electrodes.

Incidentally, since the frame region of a touch panel is a region where detection of the touch location is not possible, reducing the area of the frame region has been an important goal in order to increase product value. The frame region requires metal wiring in order to transmit the detection signal of a touch location, but the width of the metal wiring must be narrowed to reduce the frame area. Because of the insufficiently high conductivity of ITO, metal wirings are generally formed of copper.

However, in the touch panels mentioned above, corrosive components such as moisture and salts can infiltrate from the sensing region into the interior upon contact with the fingertip. When corrosive components infiltrate into the interior of a touch panel, the metal wiring may corrode, electrical resistance between the electrodes and driving circuits may increase, and wire breakage can occur.

In order to prevent corrosion of metal wirings, there have been disclosed electrostatic capacitive projection-type touch panels with insulating layers formed on metals (Patent document 1, for example). In such touch panels, a silicon dioxide layer is formed on metal by a plasma chemical vapor deposition method (plasma CVD), thereby preventing corrosion of the metal. However, because such methods employ plasma CVD, they require high-temperature treatment, and therefore the base materials are limited and production cost is increased.

Incidentally, known methods for providing resist films on necessary locations include methods in which a photosensitive layer comprising a photosensitive resin composition is provided on a prescribed base material and the photosensitive layer is exposed and developed (Patent documents 2 to 4, for example). Also, Patent documents 5 and 6 disclose formation of protective coats for touch panels by such methods.

CITATION LIST

Patent Literature

[Patent document 1] Japanese Unexamined Patent Application Publication No. 2011-28594
[Patent document 2] Japanese Unexamined Patent Application Publication HEI No. 7-253666
[Patent document 3] Japanese Unexamined Patent Application Publication No. 2005-99647
[Patent document 4] Japanese Unexamined Patent Application Publication HEI No. 11-133617
[Patent document 5] Japanese Unexamined Patent Application Publication No. 2010-27033
[Patent document 6] Japanese Unexamined Patent Application Publication No. 2011-232584

SUMMARY OF INVENTION

Technical Problem

Fabrication of a protective coat by a photosensitive resin composition can potentially reduce cost compared to plasma CVD. However, when a protective coat is to be formed on an electrode for a touch panel, a large thickness of the resin film can result in conspicuous level differences between locations with the coat and locations without the coat. The protective coat is therefore preferred to be as thin as possible.

However, the present inventors have found that when a photosensitive layer composed of a photosensitive resin composition is formed on a base material to a thickness of 10 μm or smaller and the photosensitive layer is patterned by exposure and development, the resolution tends to be reduced. Furthermore, although with the photosensitive resin compositions described in PTLs 5 and 6 it is possible to form a protective coat with high transparency as a thin-film, there has been room for improvement in terms of pattern formation.

It is an object of the present invention to provide a method for forming a resin cured film pattern that allows formation of a resin cured film pattern at sufficient resolution even as a thin-film, and a photosensitive resin composition that can form a resin cured film having a satisfactory pattern shape on a base material even as a thin-film, as well as a photosensitive element, a method for manufacturing a touch panel and a resin cured film.

Solution to Problem

As a result of diligent research directed toward solving the problems described above, the present inventors have found that by using a photosensitive resin composition containing a specific binder polymer, a photopolymerizable compound and a specific photopolymerization initiator, it is possible to form a satisfactory resin cured film pattern having sufficient resolution even when the photosensitive layer has been formed to a thickness of 10 μm or smaller, and the invention has been completed upon this finding.

The method for forming a resin cured film pattern according to the invention comprises a first step in which on a base material there is formed a photosensitive layer composed of a photosensitive resin composition comprising a binder polymer with a carboxyl group having an acid value of 75 mgKOH/g or greater, a photopolymerizable compound and a photopolymerization initiator, and having a thickness of 10 μm or smaller, a second step in which prescribed sections of the photosensitive layer are cured by irradiation with active light rays, and a third step in which the sections of the photosensitive layer other than the prescribed sections are removed to form a cured film pattern of the prescribed sections of the photosensitive layer, wherein the photosensitive resin composition comprises an oxime ester compound and/or a phosphine oxide compound as the photopolymerization initiator.

According to the method for forming a resin cured film pattern of the invention it is possible to form on a base material a resin cured film pattern having sufficient resolution even with a thin-film where the thickness is 10 μm or smaller.

The present inventors believe that the reason for this effect exhibited by the method of the invention is as follows. Firstly, the present inventors believe that one factor for the reduced sensitivity is that a smaller photosensitive layer thickness increases the effect of light scattering through the base material, generating halation. The present inventors presume that, according to the invention, the oxime site in the oxime ester compound or the phosphine oxide site in the phosphine oxide compound has relatively high photodecomposition efficiency and a suitable threshold value such that it does not decompose with scant levels of leaked light, and therefore the effect of leaked light is minimized and consequently sufficient resolution is obtained.

In the method for forming a resin cured film pattern of the invention, the photosensitive resin composition preferably further comprises an ultraviolet absorber from the viewpoint of further increasing the resolution. Including an ultraviolet absorber will allow absorption of leaked light in the photosensitive layer.

From the viewpoint of minimizing decomposition of the oxime ester compound or phosphine oxide compound by leaked light and further increasing the resolution, the ultraviolet absorber is preferably one having a maximum absorption wavelength in the wavelength range of no longer than 360 nm.

Also, from the viewpoint of further increasing the resolution, preferably the absorbance of the photosensitive layer at 365 nm is no greater than 0.4 and the absorbance at 334 nm is 0.4 or greater. If the photosensitive layer has such absorption properties, leaked light will be absorbed more easily, and it will be possible to minimize decomposition of the oxime ester compound or phosphine oxide compound by leaked light.

In the method for forming a resin cured film pattern according to the invention, the photosensitive layer preferably has a minimum visible light transmittance of 85% or greater at 400 to 700 nm.

When a protective coat on an electrode for a touch panel is to be formed, a higher transparency is preferred for the resin cured film in consideration of visibility and aesthetic appearance of the touch panel. With a conventional photosensitive resin composition, however, photoreaction is employed utilizing primarily light from the ultraviolet region to the visible light region, and therefore photoinitiator components are usually used that have absorption reaching the visible light region. Purposes requiring pigments or dyes are also common, in which cases it is difficult to ensure transparency. In contrast, in the method for forming a resin cured film pattern according to the invention, a specific photosensitive layer is formed and it is irradiated with active light rays, thereby allowing sufficient resolution to be obtained even when the minimum visible light transmittance of the photosensitive layer is 85% or greater.

Also, the photosensitive layer preferably has a b* value of −0.2 to 1.0 based on the CIELAB color system.

This will make it possible to adequately prevent loss of visibility or aesthetic appearance even when forming a resin cured film pattern as a protective coat on an electrode in the sensing region of a touch panel.

In the method for forming a resin cured film pattern of the invention, the base material may be provided with electrodes for a touch panel and a resin cured film pattern may be formed as a protective coat on the electrodes.

Also, in the method for forming a resin cured film pattern according to the invention, a photosensitive element is prepared comprising a support film and a photosensitive layer composed of the photosensitive resin composition provided on the support film, and the photosensitive layer of the photosensitive element can be transferred onto the base material to provide the photosensitive layer. This will allow the photosensitive element to be used for simple formation of a protective coat with a uniform film thickness.

The invention further provides a photosensitive resin composition for formation of a resin cured film pattern with a thickness of 10 μm or smaller, which comprises a binder polymer with a carboxyl group having an acid value of 75 mgKOH/g or greater, a photopolymerizable compound and a photopolymerization initiator, the photopolymerization initiator including an oxime ester compound and/or a phosphine oxide compound.

With a photosensitive resin composition of the invention it is possible to form a protective coat having satisfactory pattern formability even as a thin-film, on a prescribed electrode for a touch panel.

The photosensitive resin composition of the invention preferably further comprises an ultraviolet absorber from the viewpoint of further increasing the resolution.

From the viewpoint of further increasing the resolution, the ultraviolet absorber is preferably one having a maximum absorption wavelength in the wavelength range of no longer than 360 nm.

Also, from the viewpoint of further increasing the resolution, preferably the absorbance at 365 nm is no greater than 0.4 and the absorbance at 334 nm is 0.4 or greater.

From the viewpoint of sufficient visibility of the touch panel, the photosensitive resin composition of the invention preferably has a minimum visible light transmittance of 85% or greater at 400 to 700 nm.

Also, from the viewpoint of further improving the visibility of the touch panel, the photosensitive resin composition of the invention preferably has a value of −0.2 to 1.0 for b* based on the CIELAB color system.

The invention further provides a photosensitive element comprising a support film, and a photosensitive layer composed of a photosensitive resin composition according to the invention, formed on the support film.

With a photosensitive element of the invention it is possible to form a protective coat having satisfactory pattern formability even as a thin-film, on a prescribed electrode for a touch panel.

The thickness of the photosensitive layer may be 10 μm or smaller.

The invention still further provides a method for manufacturing a touch panel, comprising a step of forming, on a base material with an electrode for a touch panel, a resin cured film pattern as a protective coat covering all or a portion of the electrode by the method for forming a resin cured film pattern according to the invention.

The invention still further provides a resin cured film composed of a cured photosensitive resin composition of the invention.

Advantageous Effects of Invention

According to the invention it is possible to provide a method for forming a resin cured film pattern that allows formation of a resin cured film pattern at sufficient resolution even with a thin-film, and a photosensitive resin composition that can form a resin cured film having a satisfactory pattern shape on an electrode for a touch panel even with a thin-film, as well as a photosensitive element, a method for manufacturing a touch panel and a resin cured film.

Also, the method for forming a resin cured film pattern of the invention can be suitably used to form a protective coat for an electronic part that requires protection with a thin-film, such as a protective coat on an electrode for a touch panel, and particularly a protective coat for a metal electrode in an electrical capacitance-type touch panel.

DESCRIPTION OF EMBODIMENTS

Embodiments for carrying out the invention will now be explained in further detail. However, the present invention is not limited to the embodiments described below. Throughout the present specification, "(meth)acrylic acid" refers to acrylic acid or methacrylic acid, "(meth)acrylate" refers to acrylate or its corresponding methacrylate, and "(meth) acryloyl group" refers to an acryloyl or methacryloyl group. Also, "(poly)oxyethylene chain" refers to an oxyethylene or polyoxyethylene group, and "(poly)oxypropylene chain" refers to an oxypropylene or polyoxypropylene group.

Also as used herein, the term "step" includes not only an independent step, but also cases where it cannot be clearly distinguished from other steps, so long as the desired effect of the step can be achieved. As used herein, a numerical range using "to" represents a range including the numerical values specified as the minimum and maximum values for the range.

Also, the contents of the components in compositions referred to herein, in cases where the composition contains more than one substance corresponding to each component in the composition, are the total amounts of those substances in the composition, unless otherwise specified.

Figure 1:
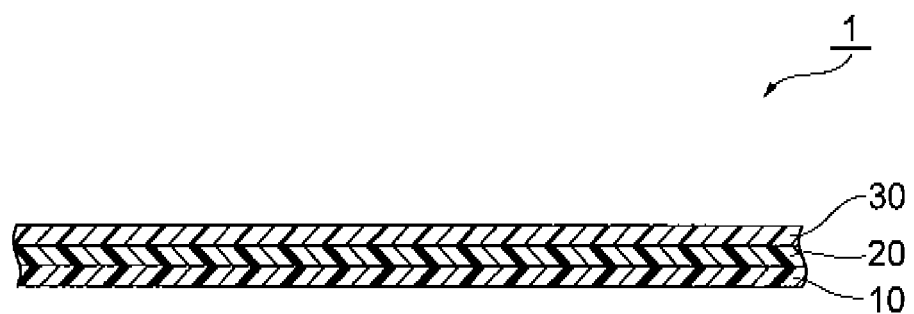
FIG. 1 is a schematic cross-sectional view showing an embodiment of a photosensitive element of the invention.

FIG. 1 is a schematic cross-sectional view showing an embodiment of a photosensitive element of the invention. The photosensitive element 1 shown in FIG. 1 comprises a support film 10, a photosensitive layer 20 composed of a photosensitive resin composition according to the invention formed on the support film 10, and a protective coat 30 formed on the side of the photosensitive layer 20 opposite the support film 10.

The photosensitive element of this embodiment can be suitably used to form a protective coat on an electrode for a touch panel.

As used herein, the term "electrode for a touch panel" includes not only the electrode in the sensing region of a touch panel, but also the metal wiring in the frame region. The protective coat may be provided for one or both electrodes.

The support film 10 used may be a polymer film. Examples of polymer films include films made of polyethylene terephthalate, polycarbonate, polyethylene, polypropylene, polyethersulfone and the like.

The thickness of the support film 10 is preferably 5 to 100 μm, more preferably 10 to 70 μm, even more preferably 15 to 40 μm and most preferably 20 to 35 μm, from the viewpoint of ensuring coverability and minimizing reduction in resolution during irradiation with active light rays through the support film 10.

The photosensitive resin composition of the invention used to form the photosensitive layer 20 comprises a binder polymer with a carboxyl group having an acid value of 75 mgKOH/g or greater (hereunder also referred to as "component (A)"), a photopolymerizable compound (hereunder also referred to as "component (B)") and a photopolymerization initiator (hereunder also referred to as "component (C)"), and the photopolymerization initiator includes an oxime ester compound and/or a phosphine oxide compound.

For this embodiment, component (A) is preferably a copolymer containing a structural unit derived from (a) (meth)acrylic acid and (b) an alkyl (meth)acrylate ester.

Examples for the alkyl (meth)acrylate include methyl (meth)acrylate, ethyl (meth)acrylate, butyl (meth)acrylate, 2-ethylhexyl (meth)acrylate and hydroxylethyl (meth)acrylate.

The copolymer may also contain in the structural unit another monomer that is copolymerizable with component (a) and/or component (b).

Examples of other monomers that are copolymerizable with component (a) and/or component (b) include tetrahydrofurfuryl (meth)acrylate, dimethylaminoethyl (meth)acrylate, diethylaminoethyl (meth)acrylate, glycidyl (meth)acrylate, benzyl (meth)acrylate, 2,2,2-trifluoroethyl (meth)acrylate, 2,2,3,3-tetrafluoropropyl (meth)acrylate, (meth) acrylamide, (meta)acrylonitrile, diacetone (meth)acrylamide, styrene and vinyltoluene. For synthesis of a binder polymer as component (A), the monomer component used may be of a single type or a combination of two or more types.

From the viewpoint of resolution, the weight-average molecular weight of the binder polymer as component (A) is preferably 10,000 to 200,000, more preferably 15,000 to 150,000, even more preferably 30,000 to 150,000, yet more preferably 30,000 to 100,000 and most preferably 40,000 to 100,000. The measuring conditions for the weight-average molecular weight are the same measuring conditions as in the examples of the present specification.

From the standpoint of excellent patternability, the acid value of the binder polymer as component (A) is preferably 75 to 200 mgKOH/g, more preferably 75 to 150 mgKOH/g and even more preferably 75 to 120 mgKOH/g.

The acid value of the binder polymer as component (A) can be measured in the following manner.

Specifically, a 1 g portion of binder polymer for measurement of the acid value is first precisely weighed out. A 30 g portion of acetone is added to the weighed binder polymer to homogeneously dissolve it. Next, an appropriate amount of phenolphthalein is added to the solution as an indicator, and a 0.1N KOH aqueous solution is used for titration. The acid value is then calculated by the following formula.

$$\text{Acid value} = 0.1 \times Vf \times 56.1/(Wp \times I/100)$$

In the formula, Vf represents the titer (mL) of the KOH aqueous solution, Wp represents the weight (g) of the solution containing the weighed binder polymer, and I represents the measured proportion (mass %) of nonvolatile components in the solution containing the binder polymer.

When the binder polymer is added in admixture with volatile components such as a synthetic solvent or diluting solvent, the acid value is measured after first heating for 1 to 4 hours at a temperature at least 10° C. higher than the boiling point of the volatile components, before weighing, to remove the volatile components.

The photopolymerizable compound used as component (B) may be a photopolymerizable compound with an ethylenic unsaturated group.

Examples of photopolymerizable compounds with ethylenic unsaturated groups include monofunctional vinyl monomers, bifunctional vinyl monomers and polyfunctional vinyl monomers having at least three polymerizable ethylenic unsaturated groups.

Examples of monofunctional vinyl monomers include (meth)acrylic acid, alkyl (meth)acrylate and monomers that are copolymerizable therewith, which were mentioned as monomers to be used for synthesis of the suitable examples of copolymers for component (A).

Examples of bifunctional vinyl monomers include polyethylene glycol di(meth)acrylate, trimethylolpropane di(meth)acrylate, polypropylene glycol di(meth)acrylate, bisphenol A polyoxyethylenepolyoxypropylene di(meth)acrylate (2,2-bis(4-(meth)acryloxypolyethoxypolypropoxyphenyl) propane), bisphenol A diglycidyl ether di(meth)acrylate and the like; and ester compounds of polybasic carboxylic acids (such as phthalic anhydride) and substances having a hydroxyl group and an ethylenic unsaturated group (β-hydroxyethyl acrylate, β-hydroxyethyl methacrylate and the like).

Examples of polyfunctional vinyl monomers having at least three polymerizable ethylenic unsaturated groups include compounds obtained by reacting α,β-unsaturated saturated carboxylic acids with polyhydric alcohols, such as trimethylolpropane tri(meth)acrylate, tetramethylolmethane tri(meth)acrylate, tetramethylolmethane tetra(meth)acrylate, dipentaerythritol penta(meth)acrylate and dipentaerythritol hexa(meth)acrylate, and compounds obtained by adding α,β-unsaturated carboxylic acids to glycidyl group-containing compounds, such as trimethylolpropane-triglycidyl ether triacrylate.

Among these are preferred those containing a polyfunctional vinyl monomer having at least three polymerizable ethylenic unsaturated groups. From the viewpoint of ability to minimize electrode corrosion and facilitating development, there are preferred one or more selected from among (meth)acrylate compounds having a pentaerythritol-derived backbone, (meth)acrylate compounds having a dipentaerythritol-derived backbone and (meth)acrylate compounds having a trimethylolpropane-derived backbone, and more preferred are one or more selected from among (meth) acrylate compounds having a dipentaerythritol-derived backbone and (meth)acrylate compounds having a trimethylolpropane-derived backbone.

A (meth)acrylate having a dipentaerythritol-derived backbone is an ester compound of dipentaerythritol and (meth)acrylic acid, and such ester compounds include compounds modified with alkyleneoxy groups. These ester compounds preferably have 6 ester bonds per molecule, but they may be mixtures of compounds with 1-5 ester bonds.

Also, a (meth)acrylate compound having a trimethylolpropane-derived backbone is an ester compound of trimethylolpropane and (meth)acrylic acid, and such ester compounds include compounds modified with alkyleneoxy groups. These ester compounds preferably have 3 ester bonds per molecule, but they may be mixtures of compounds with 1 to 2 ester bonds.

These compounds may be used alone or in combinations of two or more different ones.

When a monomer having at least three polymerizable ethylenic unsaturated groups in the molecule is to be used in combination with a monofunctional vinyl monomer or a bifunctional vinyl monomer, there are no particular restrictions on the proportion in which they are used, but from the viewpoint of the photocuring property and minimizing electrode corrosion, the proportion of the monomer having at least three polymerizable ethylenic unsaturated groups in the molecule is preferably 30 parts by mass or greater, more preferably 50 parts by mass or greater and even more preferably 75 parts by mass or greater, with respect to 100 parts by mass as the total of the photopolymerizable compound in the photosensitive resin composition.

The content of component (A) and component (B) in the photosensitive resin composition of this embodiment is preferably 35 to 85 parts by mass of component (A) and 15 to 65 parts by mass of component (B), more preferably 40 to 80 parts by mass of component (A) and 20 to 60 parts by mass of component (B), even more preferably 50 to 70 parts by mass of component (A) and 30 to 50 parts by mass of component (B) and most preferably 55 to 65 parts by mass of component (A) and 35 to 45 parts by mass of component (B), with respect to 100 parts by mass as the total of component (A) and component (B). Particularly from the viewpoint of maintaining transparency and pattern formability, the contents of component (A) and component (B) are preferably component (A) at 35 parts by mass or greater, more preferably 40 parts by mass or greater, even more preferably 50 parts by mass or greater and most preferably 55 parts by mass or greater, with respect to 100 parts by mass as the total of component (A) and component (B).

If the contents of component (A) and component (B) are within this range, it will be possible to obtain adequate sensitivity while guaranteeing sufficient coatability or film properties of the photosensitive element, and to adequately ensure the photocuring property, developability and electrode corrosion.

The photosensitive resin composition of this embodiment contains as an essential component an oxime ester compound and/or a phosphine oxide compound as a photopolymerization initiator which is component (C). By including an oxime ester compound and/or a phosphine oxide compound, it is possible to form a resin cured film pattern having sufficient resolution even with a thin-film having a thickness of 10 μm or smaller on the base material. It is also possible to form a resin cured film pattern with excellent transparency.

The reason for this obtained effect is conjectured by the present inventors to be as follows. Firstly, the present inventors believe that one factor for the reduced sensitivity is that a smaller photosensitive layer thickness increases the effect of light scattering through the base material, generating halation. The present inventors presume that, for this embodiment, the oxime site in the oxime ester compound or the phosphine oxide site in the phosphine oxide compound has relatively high photodecomposition efficiency and a suitable threshold value such that it does not decompose with scant levels of leaked light, and therefore the effect of leaked light is minimized and consequently sufficient resolution is obtained.

The oxime ester compound may be a compound represented by the following formula (C-1) or formula (C-2). From the viewpoint of fast-curing properties and transparency, a compound represented by the following formula (C-1) is preferred.

In formula (C-1), $R^1$ represents a C1-12 alkyl or C3-20 cycloalkyl group. So long as the effect of the invention is not impeded, a substituent may be present on the aromatic ring in formula (C-1).

In formula (C-1), $R^1$ is preferably a C3-10 alkyl or C4-15 cycloalkyl group, and more preferably a C4-8 alkyl or C4-10 cycloalkyl group.

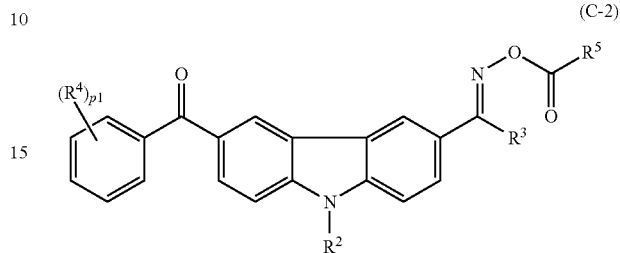

(C-2)

In formula (C-2), $R^2$ represents hydrogen or a C1-12 alkyl group, $R^3$ represents a C1-12 alkyl or C3-20 cycloalkyl group, $R^4$ represents a C1-12 alkyl group and $R^5$ represents a C1-20 alkyl or aryl group. The symbol p1 represents an integer of 0-3. When p1 is 2 or greater, the multiple $R^4$ groups may be the same or different. The carbazole ring may also have a substituent so long as the effect of the invention is not impeded.

In formula (C-2), $R^2$ is preferably a C1-12 alkyl group, more preferably a C1-8 alkyl group and even more preferably a C1-4 alkyl group.

In formula (C-2), $R^3$ is preferably a C1-8 alkyl or C4-15 cycloalkyl group, more preferably a C1-4 alkyl or C4-10 cycloalkyl group, and most preferably an ethyl group.

The compound represented by formula (C-1) may be 1,2-octanedione,1-[4-(phenylthio)phenyl-,2-(O-benzoyloxime)] or the like. The compound represented by formula (C-2) may be ethanone,1-[9-ethyl-6-(2-methylbenzoyl)-9H-carbazol-3-yl]-,1-(O-acetyloxime). The compound 1,2-octanedione,1-[4-(phenylthio)phenyl-,2-(O-benzoyloxime)] is available as IRGACURE OXE 01 (trade name of BASF Corp.). Also, ethanone,1-[9-ethyl-6-(2-methylbenzoyl)-9H-carbazol-3-yl]-,1-(O-acetyloxime) is commercially available as IRGACURE OXE 02 (trade name of BASF Corp.). These may be used alone or in combinations of two or more.

The compound 1,2-octanedione,1-[4-(phenylthio)phenyl-,2-(O-benzoyloxime)] is especially preferred for formula (C-1). Particularly preferred for formula (C-2) is ethanone,1-[9-ethyl-6-(2-methylbenzoyl)-9H-carbazol-3-yl]-,1-(O-acetyloxime).

The phosphine oxide compound may be a compound represented by the following formula (C-3) or formula (C-4). From the viewpoint of fast-curing properties and transparency, a compound represented by the following formula (C-3) is preferred.

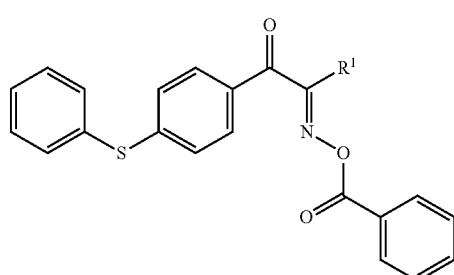

(C-1)

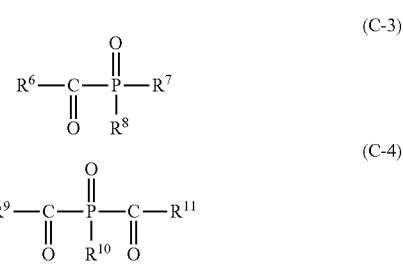

(C-3)

(C-4)

In formula (C-3), $R^6$, $R^7$ and $R^8$ each independently represent a C1-20 alkyl or aryl group. In formula (C-4), $R^9$, $R^{10}$ and $R^{11}$ each independently represent a C1-20 alkyl or aryl group.

When $R^6$, $R^7$ or $R^8$ in formula (C-3) is a C1-20 alkyl group, or when $R^9$, $R^{10}$ or $R^{11}$ in formula (C-4) is a C1-20 alkyl group, the alkyl group may be straight-chain, branched-chain or cyclic, and more preferably the number of carbon atoms of the alkyl group is 5-10.

When $R^6$, $R^7$ or $R^8$ in formula (C-3) is an aryl group or when $R^9$, $R^{10}$ or $R^{11}$ in formula (C-4) is an aryl group, the aryl group may be optionally substituted. Examples of substituents include C1-6 alkyl and C1-4 alkoxy groups.

Of these, $R^6$, $R^7$ and $R^8$ in formula (C-3) are preferably aryl groups. Also, $R^9$, $R^{10}$ and $R^{11}$ in formula (C-4) are preferably aryl groups.

The compound represented by formula (C-3) is preferably 2,4,6-trimethylbenzoyl-diphenyl-phosphine oxide, in consideration of transparency of the protective coat to be formed and pattern formability with a film thickness of 10 μm or smaller. The compound 2,4,6-trimethylbenzoyl-diphenyl-phosphine oxide is commercially available as LUCIRIN TPO (trade name of BASF Corp.), for example.

Component (C) may be used in combination with a photoinitiator other than the oxime ester compound and phosphine oxide compound. Examples of photopolymerization initiators other than oxime ester compounds and phosphine oxide compounds include aromatic ketones such as benzophenone, 4-methoxy-4'-dimethylaminobenzophenone and 2-benzyl-2-dimethylamino-1-(4-morpholinophenyl)-butanone-1,2-methyl-1-[4-(methylthio)phenyl]-2-morpholino-propanone-1; benzoinether compounds such as benzoinmethyl ether, benzoinethyl ether and benzoinphenyl ether; benzoin compounds such as benzoin, methylbenzoin and ethylbenzoin; benzyl derivatives such as benzyldimethylketal; acridine derivatives such as 9-phenylacridine and 1,7-bis(9,9'-acridinyl)heptane; N-phenylglycine and N-phenylglycine derivatives; coumarin-based compounds; and oxazole-based compounds. A combination of a thioxanthone-based compound and tertiary amine compound may also be used, such as a combination of diethylthioxanthone and dimethylaminobenzoic acid.

The content of the photopolymerization initiator as component (C) is preferably 0.1 to 20 parts by mass, more preferably 1 to 10 parts by mass and more preferably 2 to 5 parts by mass, with respect to 100 parts by mass as the total of component (A) and component (B).

The content of component (C) is preferably 0.1 part by mass or greater from the viewpoint of excellent photosensitivity and resolution, and it is preferably no greater than 20 parts by mass from the viewpoint of visible light transmittance.

The photosensitive resin composition of this embodiment may further contain an ultraviolet absorber (hereunder also referred to as "component (D)"). From the viewpoint of reflected light absorption the ultraviolet absorber is preferably one with excellent absorbing power for ultraviolet rays with wavelengths of up to 380 nm, and from the viewpoint of transparency it is preferably one with low absorption for visible light with wavelengths of 400 nm and longer. Specifically, these include ultraviolet absorbers with maximum absorption wavelengths of up to 360 nm.

Examples of ultraviolet absorbers include oxybenzophenone-based compounds, benzotriazole-based compounds, salicylic acid ester-based compounds, benzophenone-based compounds, diphenyl acrylate-based compounds and nickel complex salt-based compounds. Particularly preferred ultraviolet absorbers are diphenyl acrylate-based compounds such as diphenyl cyanoacrylate.

The content of the ultraviolet absorber as component (D) is preferably 0.1 to 30 parts by mass, more preferably 1 to 20 parts by mass and more preferably 2 to 10 parts by mass, with respect to 100 parts by mass as the total of component (A) and component (B).

From the viewpoint of excellent resolution, the content of component (D) is preferably 0.1 part by mass or greater, and from the viewpoint of avoiding increased absorption on the surface of the composition during active light irradiation that results in insufficient photocuring in the interior, it is preferably no greater than 30 parts by mass.

The photosensitive resin composition of this embodiment may also contain, if necessary, a tackifier such as a silane coupling agent, or a leveling agent, plasticizer, filler, antifoaming agent, flame retardant, stabilizer, antioxidant, aromatic, thermal crosslinking agent, polymerization inhibitor or the like, at about 0.01 to 20 parts by mass each with respect to 100 parts by mass as the total of component (A) and component (B). They may be used alone or in combinations of two or more.

The minimum visible light transmittance of the photosensitive resin composition of this embodiment at 400 to 700 nm is preferably 85% or greater, more preferably 92% or greater and even more preferably 95% or greater.

The visible light transmittance of the photosensitive resin composition is determined in the following manner. First, a support film is coated with a coating solution containing the photosensitive resin composition, to a post-drying thickness of 10 μm or smaller, and it is dried to form a photosensitive resin composition layer (photosensitive layer). Next, it is laminated onto a glass panel using a laminator, with the photosensitive resin composition layer (photosensitive layer) in contact. A measuring sample is thus obtained having a photosensitive resin composition layer and a support film laminated on a glass panel. The obtained measuring sample is then irradiated with ultraviolet rays to photocure the photosensitive resin composition layer, after which an ultraviolet and visible spectrophotometer is used to measure the transmittance in a measuring wavelength range of 400 to 700 nm.

The "preferred transmittance" means the minimum transmittance in the specified wavelength range.

If the transmittance is at least 85% in a wavelength range of 400 to 700 nm, which are light rays in the ordinary visible light wavelength range, for example, when a transparent electrode in the sensing region of a touch panel (touch sensor) is to be protected, or when the protective coat is visible from the edges of the sensing region after a metal layer (for example, a copper layer formed on an ITO electrode) in the frame region of a touch panel (touch sensor) has been protected, it will be possible to satisfactorily minimize reduction in the image display quality, color shade and brightness in the sensing region.

Also, the photosensitive resin composition of this embodiment has a value of preferably −0.2 to 1.0, more preferably 0.0 to 0.7 and even more preferably 0.1 to 0.4 for b* based on the CIELAB color system, when the protective coat has been formed. As with a minimum visible light transmittance of 85% or greater, b* is preferably −0.2 to 0.8 from the viewpoint of preventing reduction in image display quality and color shade in the sensing region. Measurement of b* based on the CIELAB color system can be accomplished, for example, using a "CM-5" spectrocolorimeter by Konica Minolta Holdings, Inc., forming a photosensitive resin composition layer with a thickness of 10 μm or smaller on a glass panel with a b* value of 0.1 to 0.2 and a thickness of 0.7 mm, irradiating it with ultraviolet rays to photocure the photosensitive resin composition layer, and then performing measurement with a D65 light source and the viewing angle set to 2°.

Also, from the viewpoint of further increasing the resolution, the photosensitive resin composition of this embodiment preferably has an absorbance of no greater than 0.4 at 365 nm. Also, the absorbance at 334 nm is preferably 0.4 or greater. If the photosensitive layer has such absorption properties, leaked light will be absorbed more easily, and it will be possible to minimize decomposition of the oxime ester compound or phosphine oxide compound by leaked light.

The absorbance can be measured using a UV spectrophotometer (U-3310 spectrophotometer by Hitachi, Ltd.). The measurement is carried out by placing on the measuring side a photosensitive element having a photosensitive layer made of the photosensitive resin composition formed to the desired film thickness on a support film, placing the support film on the reference side, and conducting continuous measurement in absorbance mode up to 300 to 700 nm, and reading off the values for 334 nm and 365 nm.

The method of adjusting the absorbance in the aforementioned range may be, for example, mixture of the oxime ester compound and/or phosphine oxide compound and the ultraviolet absorber, or control of the film thickness of the photosensitive layer.

The photosensitive resin composition of this embodiment may be used to form a photosensitive layer on a base material. For example, a coating solution that can be obtained by uniformly dissolving or dispersing the photosensitive resin composition in a solvent may be coated on a base material to form a coating film, and the solvent removed by drying to form a photosensitive layer.

The solvent used may be a ketone, aromatic hydrocarbon, alcohol, glycol ether, glycol alkyl ether, glycol alkyl ether acetate, ester or diethylene glycol, from the viewpoint of the solubility of each component and ease of coating film formation. These solvents may be used alone, or a mixed solvent may be used, comprising two or more different solvents.

Preferred for use among these solvents are ethyleneglycol monobutyl ether acetate, diethyleneglycol monoethyl ether acetate, diethyleneglycol diethyl ether, diethyleneglycol ethyl methyl ether, diethyleneglycol dimethyl ether, propyleneglycol monomethyl ether and propyleneglycol monomethyl ether acetate.

The photosensitive resin composition of the invention is preferably used to form a photosensitive film, as for a photosensitive element. By laminating a photosensitive film on a base material with an electrode for a touch panel, it is possible to significantly contribute to shortening of the production process and reduction of costs, by allowing a roll-to-roll process to be easily accomplished and by shortening the solvent drying step, for example.

The photosensitive layer 20 of the photosensitive element 1 can be formed by preparing a coating solution containing the photosensitive resin composition of this embodiment, and coating and drying it on a support film 10. The coating solution can be obtained by uniformly dissolving or dispersing each of the components used to form the photosensitive resin composition of this embodiment, in a solvent.

There are no particular restrictions on the solvent, and a known one may be used such as acetone, methyl ethyl ketone, methyl isobutyl ketone, toluene, methanol, ethanol, propanol, butanol, methylene glycol, ethylene glycol, propylene glycol, ethyleneglycol monomethyl ether, ethyleneglycol monoethyl ether, diethyleneglycol dimethyl ether, diethyleneglycol ethyl methyl ether, diethyleneglycol diethyl ether, propyleneglycol monomethyl ether, ethyleneglycol monobutyl ether acetate, diethyleneglycol monoethyl ether acetate, propyleneglycol monomethyl ether acetate, chloroform or methylene chloride, for example. These solvents may be used alone, or a mixed solvent may be used, comprising two or more different solvents.

The coating method may be, for example, doctor blade coating, Meyer bar coating, roll coating, screen coating, spinner coating, ink-jet coating, spray coating, dip coating, gravure coating, curtain coating or die coating.

There are no particular restrictions on the drying conditions, but the drying temperature is preferably 60° C. to 130° C. and the drying time is preferably 0.5 to 30 minutes.

The thickness of the photosensitive layer is preferably 1 μm to 9 μm, more preferably 1 μm to 8 μm, even more preferably 2 μm to 8 μm and most preferably 3 μm to 8 μm, as the post-drying thickness, in order to exhibit an adequate effect for electrode protection and to reduce to a minimum any level differences on the touch panel (touch sensor) surface that are produced by partial electrode-protecting coat formation.

The minimum visible light transmittance of the photosensitive layer 20 for this embodiment is preferably 85% or greater, more preferably 92% or greater and even more preferably 95% or greater. Also, the photosensitive layer 20 has a value of preferably −0.2 to 1.0, more preferably 0.0 to 0.7 and even more preferably 0.1 to 0.4 for b* based on the CIELAB color system, when the protective coat has been formed.

In addition, the absorbance of the photosensitive layer 20 at 365 nm is preferably no greater than 0.4. Also, the absorbance at 334 nm is preferably 0.4 or greater.

The viscosity of the photosensitive layer 20 at 30° C. is preferably 15 to 100 mPa·s, more preferably 20 to 90 mPa·s and even more preferably 25 to 80 mPa·s, from the viewpoint of preventing, for a period of one month or longer, exudation of the photosensitive resin composition from the edges of the photosensitive element 1 when the photosensitive element has been taken up into a roll, and from the viewpoint of preventing exposure defects and development residue during irradiation of active light rays, caused by adhesion of fragments of the photosensitive resin composition on the substrate when the photosensitive element 1 is cut.

The viscosity is the value obtained by forming a circular film with a diameter of 7 mm and a thickness of 2 mm from the photosensitive resin composition as a measuring sample, measuring the rate of change in thickness upon adding a load of $1.96 \times 10^{-2}$ N at 30° C. and 80° C. in the thickness direction of the sample, and calculating the viscosity from the change in thickness, assuming a Newtonian fluid.

The protective film 30 (cover film) may be, for example, a film composed of polyethylene, polypropylene, polyethylene terephthalate, polycarbonate, polyethylene-vinyl acetate copolymer or polyethylene-vinyl acetate copolymer, or a laminated film of polyethylene-vinyl acetate copolymer and polyethylene.

The thickness of the protective film 30 is preferably about 5 to 100 μm, but from the viewpoint of curled storage as a roll, it is preferably no greater than 70 μm, more preferably no greater than 60 μm, even more preferably no greater than 50 μm and most preferably no greater than 40 μm.

The photosensitive element 1 may be placed in curled storage as a roll, or used directly.

According to the invention, a coating solution containing the photosensitive resin composition of this embodiment and a solvent is coated onto a base material having an electrode for a touch panel, and dried to form a photosensitive layer 20 composed of the photosensitive resin composition. For this purpose as well, the photosensitive layer preferably satisfies the aforementioned conditions for film thickness, visible light transmittance, CIELAB color system b* value and absorbance.

A method of forming a protective coat on an electrode for a touch panel will now be described, as an embodiment of a method for forming a resin cured film pattern according to the invention. FIG. 2 is a schematic cross-sectional view for illustration of an example of a method for forming a resin cured film pattern according to the invention.

The method for forming a protective coat on an electrode for a touch panel according to this embodiment comprises a first step in which a photosensitive layer 20 with a thickness of 10 µm or smaller, comprising a photosensitive resin composition according to this embodiment is formed on a base material 100 having electrodes for a touch panel 110 and 120, a second step in which prescribed sections of the photosensitive layer 20 are cured by irradiation with active light rays including ultraviolet rays, and a third step in which the photosensitive layer at the sections other than the prescribed sections (the sections of the photosensitive layer that have not been irradiated with active light rays) are removed after the irradiation with active light rays, to form a protective coat 22 comprising a cured film pattern of the photosensitive resin composition covering all or a portion of the electrodes. A protective coat-covered touch panel (touch sensor) 200 is thus obtained as a touch input sheet.

The base material 100 to be used for this embodiment may be a substrate such as a glass plate, plastic sheet or ceramic sheet commonly used for touch panels (touch sensors). On the substrate there is provided an electrode for a touch panel on which the resin cured film is to be formed as a protective coat. The electrode may be an ITO, Cu, Al or Mo electrode, or TFT. An insulating layer may also be provided on the substrate between the substrate and the electrode.

The base material 100 having electrodes for a touch panel 110 and 120 shown in FIG. 2 can be obtained by the following procedure, for example. After forming a metal film by sputtering in the order ITO, Cu on a base material 100 such as a PET film, a photosensitive film for etching is attached onto the metal film, a desired resist pattern is formed, and the unwanted Cu is removed with an etching solution such as an iron chloride aqueous solution, after which the resist pattern is peeled off.

Figure 2A:
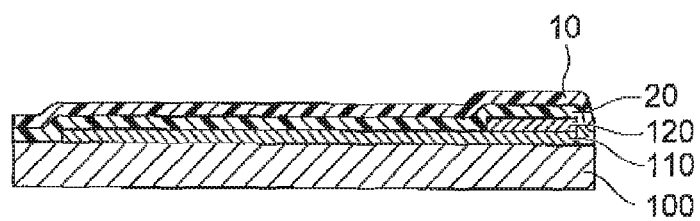
FIG. 2(A) is a schematic cross-sectional view for illustration of a first step of an embodiment of a method for forming a resin cured film pattern according to the invention.

In the first step of this embodiment, the protective film 30 of the photosensitive element 1 of this embodiment is removed and then the photosensitive layer 20 is transferred onto the surface of the base material 100 on which the electrodes for a touch panel 110 and 120 are formed, by contact bonding while heating the photosensitive element, to accomplish lamination (see FIG. 2(A)).

The contact bonding means may be a contact bonding roll. The contact bonding roll may be one provided with heating means to allow thermocompression bonding.

The heating temperature for thermocompression bonding is preferably 10° C. to 180° C., more preferably 20° C. to 160° C. and even more preferably 30° C. to 150° C. so that the constituent components of the photosensitive layer 20 will be more resistant to thermosetting or thermal decomposition, while ensuring sufficient adhesiveness between the photosensitive layer 20 and the base material 100 and sufficient adhesiveness between the photosensitive layer 20 and the electrodes for a touch panel 110 and 120.

Also, the contact bonding pressure during thermocompression bonding is preferably 50 to $1\times10^5$ N/m, more preferably $2.5\times10^2$ to $5\times10^4$ N/m and even more preferably $5\times10^2$ to $4\times10^4$ N/m as linear pressure, from the viewpoint of minimizing deformation of the base material 100 while ensuring sufficient adhesiveness between the photosensitive layer 20 and the base material 100.

If the photosensitive element 1 is heated in this manner it will not be necessary to perform preheating treatment of the base material, although preheating treatment of the base material 100 is preferred from the viewpoint of further increasing adhesiveness between the photosensitive layer 20 and the base material 100. The preheating temperature is preferably 30° C. to 180° C.

For this embodiment, instead of using a photosensitive element, a coating solution containing the photosensitive resin composition of this embodiment and a solvent may be prepared and coated and dried onto the surface of the base material 100 on which the electrodes for a touch panel 110 and 120 have been formed, to form a photosensitive layer 20.

The photosensitive layer 20 preferably satisfies the aforementioned conditions for film thickness, visible light transmittance, CIELAB color system b* value and absorbance.

Figure 2B:
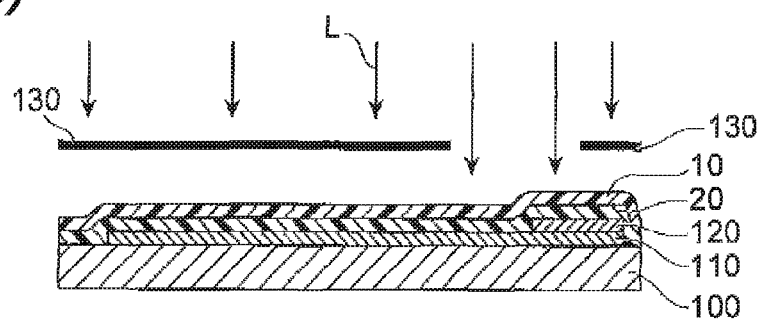
FIG. 2(B) is a schematic cross-sectional view for illustration of a second step of an embodiment of a method for forming a resin cured film pattern according to the invention.

In the second step of this embodiment, active light rays L are irradiated in a pattern on prescribed sections of the photosensitive layer 20, through a photomask 130 see FIG. 2(B)).

For irradiation of the active light rays, if the support film 10 on the photosensitive layer 20 is transparent it will be possible to irradiate the active light rays directly, but if it is opaque the active light rays are irradiated after removing it. From the viewpoint of protecting the photosensitive layer 20, preferably a transparent polymer film is used as the support film 10 and the polymer film is left on it, with the active light irradiation being performed through it.

The active light ray light source used for irradiation of the active light rays L may be a known active light source such as a carbon arc lamp, ultra-high-pressure mercury lamp, high-pressure mercury lamp or xenon lamp, with no particular restrictions so long as the ultraviolet rays can be effectively emitted.

The exposure dose for the active light rays L will usually be $1\times10^2$ to $1\times10^4$ J/m$^2$, and the irradiation may also be accompanied by heating. If the active light ray exposure dose is less than $1\times10^2$ J/m$^2$ the photocuring effect will tend to be inadequate, and if it is greater than $1\times10^4$ J/m$^2$ the photosensitive layer 20 will tend to undergo discoloration.

For this embodiment, preferably the photosensitive layer 20 has absorbance at 365 nm of no greater than 0.4 and absorbance at 334 nm of 0.4 or greater, and the active light ray light source is a combination of an ultra-high-pressure mercury lamp and a UV laser having oscillation at 355 nm or 364 nm.

Figure 2C:
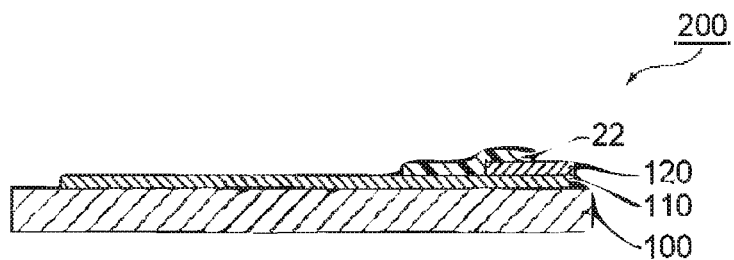
FIG. 2(C) is a schematic cross-sectional view for illustration of a third step of an embodiment of a method for forming a resin cured film pattern according to the invention.

In the third step of this embodiment, the photosensitive layer that has been irradiated with active light rays is developed with a developing solution to remove the sections that have not been exposed to active light rays (i.e. the sections other than the prescribed sections of the photosensitive layer), to form a protective coat 22 composed of a cured film pattern of the photosensitive resin composition of this embodiment with a thickness of 10 µm or smaller, covering all or a portion of the electrode (see FIG. 2(C)). The protective coat 22 formed may have a prescribed pattern.

When the support film 10 is layered on the photosensitive layer 20 after irradiation with active light rays, it is first removed, and then development is carried out with a developing solution for removal of the sections that have not been exposed to the active light rays.

The developing method preferably accomplishes development by a known method such as spraying, showering, reciprocal dipping, brushing or scrapping using a known developing solution such as an aqueous alkali solution, aqueous developing solution or organic solvent, and removal of the unwanted sections, and it is preferred to use an aqueous alkali solution from the viewpoint of the environment and safety.

The base of the aqueous alkali solution may be an alkali hydroxide (such as a hydroxide of lithium, sodium or potassium), an alkali carbonate (such as a carbonate or bicarbonate of lithium, sodium or potassium), an alkali metal phosphate (such as potassium phosphate or sodium phosphate), an alkali metal pyrophosphate (such as sodium pyrophosphate or potassium pyrophosphate), tetramethylammonium hydroxide, triethanolamine or the like, with tetramethylammonium hydroxide being preferred among these.

A sodium carbonate aqueous solution is also preferred for use, and for example, a dilute sodium carbonate solution (0.5 to 5 mass % aqueous solution) at 20° C. to 50° C. is preferably used.

The developing temperature and time can be adjusted to match the developability of the photosensitive resin composition for this embodiment.

The aqueous alkali solution may also contain added surfactants, antifoaming agents, and small amounts of organic solvents to accelerate development.

After development, the base of the aqueous alkali solution remaining on the photosensitive layer 20 after photocuring may be subjected to acid treatment (neutralizing treatment) by a known method such as spraying, reciprocal dipping, brushing, scrapping or the like using an organic acid or inorganic acid, or an aqueous solution of such acids.

A step of rinsing may also be carried out after acid treatment (neutralizing treatment).

Following development, the cured film pattern may be further cured by irradiation with active light rays (for example, $5 \times 10^3$ to $2 \times 10^4$ J/m$^2$), if necessary. The photosensitive resin composition of this embodiment exhibits excellent adhesiveness for metals even without a heating step after development, but if necessary it may be subjected to heat treatment (80° C. to 250° C.) instead of irradiation with active light rays or in combination with irradiation with active light rays, after development.

Thus, the photosensitive resin composition and photosensitive element of this embodiment is suitable for use for formation of a resin cured film pattern. Also, the photosensitive resin composition and photosensitive element of this embodiment are suitable for formation of a resin cured film pattern as a protective coat on an electrode for a touch panel (use as a resin cured film pattern forming material). For this use of the photosensitive resin composition, a coating solution in admixture with a solvent may be used to form the protective coat.

The invention can also provide a material for forming a resin cured film pattern, comprising a photosensitive resin composition according to the invention. The resin cured film pattern-forming material may comprise a photosensitive resin composition of the embodiment described above, and it is preferably a coating solution further containing the solvent mentioned above.

Figure 3:
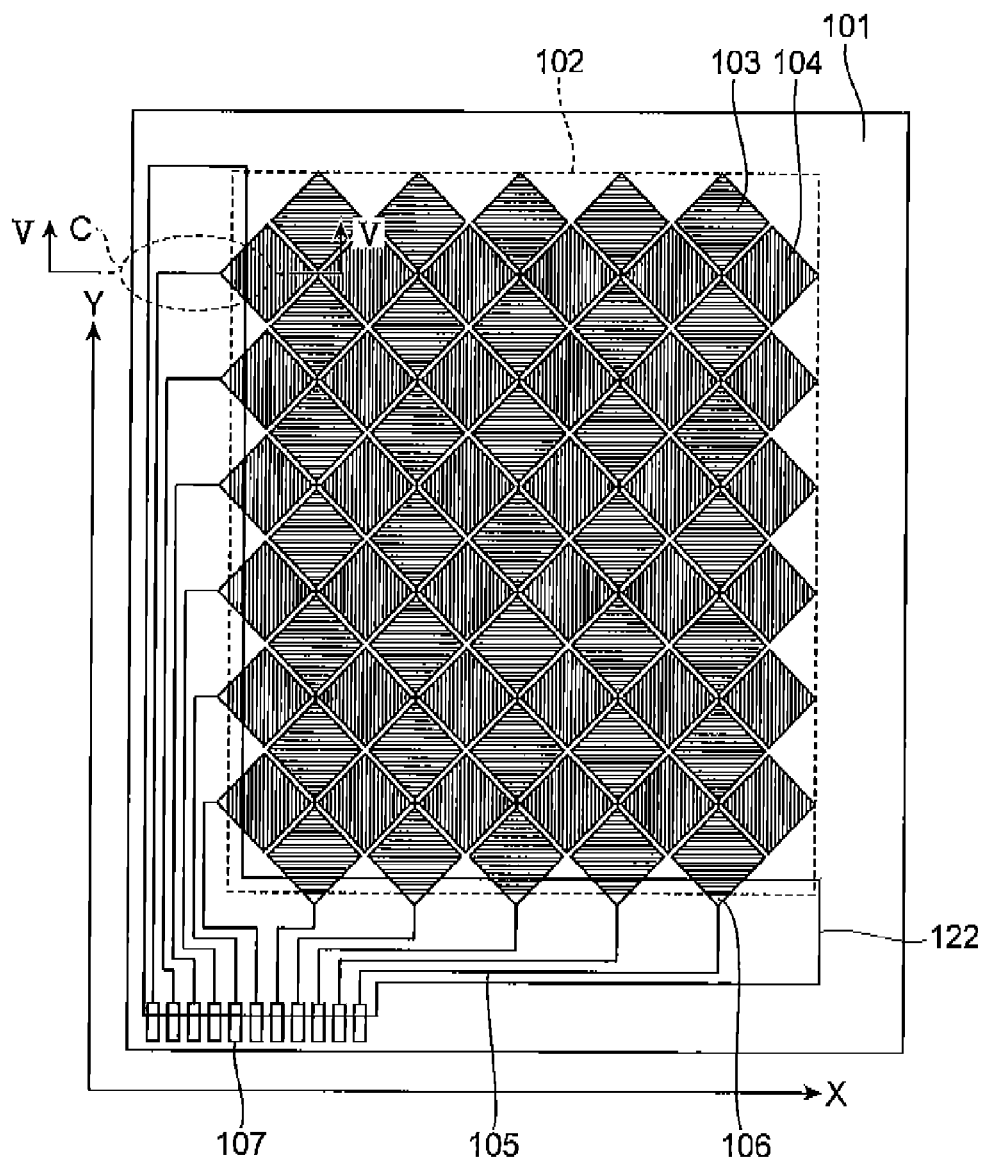
FIG. 3 is a schematic top view showing an example of an electrostatic capacitive touch panel.
Figure 4:
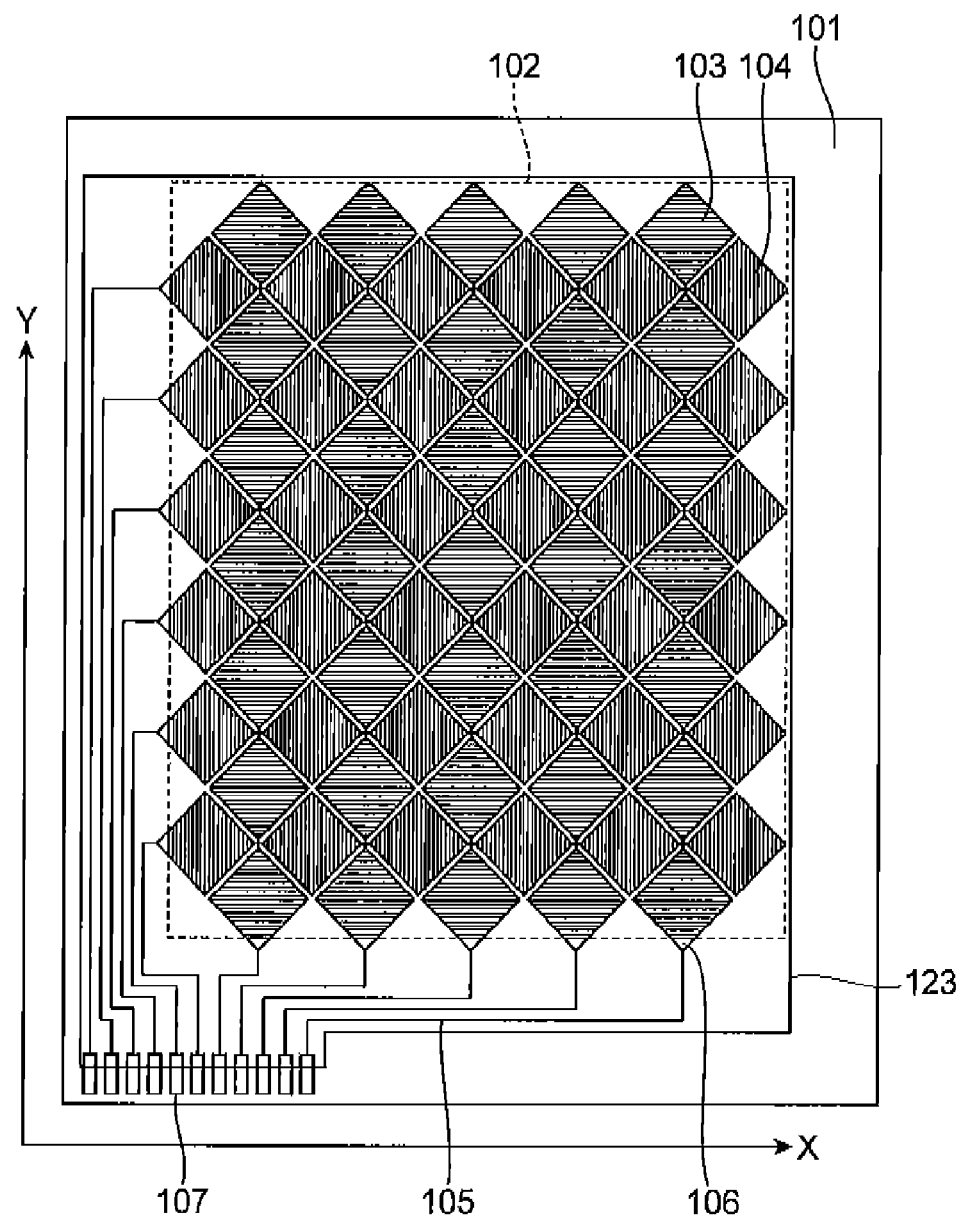
FIG. 4 is a schematic top view showing another example of an electrostatic capacitive touch panel.

An example of a part using a protective coat of the invention will now be described with reference to FIG. 3, FIG. 4 and FIG. 5. FIG. 3 is a schematic top view showing an example of an electrical capacitance-type touch panel. The touch panel illustrated in FIG. 3 has a touch screen 102 for detection of touch location coordinates on one side of a transparent substrate 101, and provided on the substrate 101 are transparent electrodes 103 and transparent electrodes 104 for detection of changes in electrostatic capacity in this region. The transparent electrodes 103 and transparent electrodes 104 detect the X-coordinate and Y-coordinate, respectively, of the touch location.

On the transparent base 101 there are provided lead wirings 105 to transmit touch location detection signals from the transparent electrodes 103 and transparent electrodes 104 to an external circuit. Also, the lead wirings 105 and the transparent electrodes 103 and transparent electrodes 104 are connected by connecting electrodes 106 provided on the transparent electrodes 103 and transparent electrodes 104. On the side opposite the connecting sections between the lead wirings 105 and the transparent electrodes 103 and transparent electrodes 104, there are provided connecting terminals 107 with an external circuit. The photosensitive resin composition of the invention can be suitably used to form a resin cured film pattern as a protective coat 122 for the lead wirings 105, connecting electrodes 106 and connecting terminals 107. This allows simultaneous protrusion of the electrodes in the sensing region. In FIG. 3, the protective coat 122 protects the lead wirings 105, connecting electrodes 106, some of the electrodes in the sensing region and some of the connecting terminals 107, but the location where the protective coat is provided may be changed as appropriate. For example, as shown in FIG. 4, the protective coat 123 may be provided protecting the entire touch screen 102.

Figure 5A:
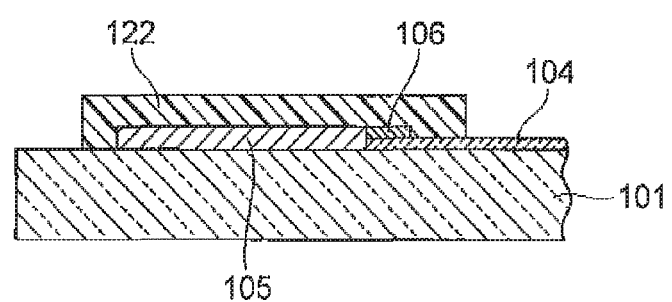
FIG. 5(A) is a partial cross-sectional view of section C of FIG. 3 along line V-V.
Figure 5B:
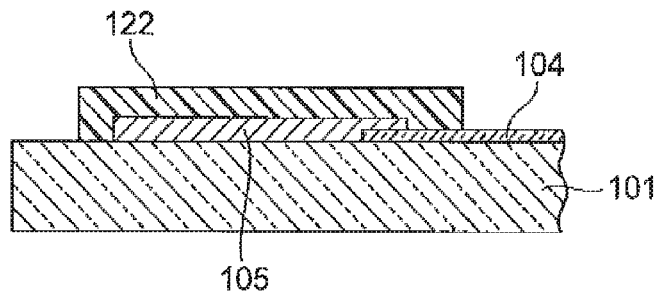
FIG. 5(B) is a partial cross-sectional view showing another mode thereof.

The cross-sectional structure of the connecting section between the transparent electrodes and lead wirings in the touch panel shown in FIG. 3 will now be explained with reference to FIG. 5. FIG. 5 is a partial cross-sectional view of section C in FIG. 3 along line V-V, showing a connecting section between a transparent electrode 104 and a lead wiring 105. As shown FIG. 5(A), the transparent electrode 104 and the lead wiring 105 are electrically connected via a connecting electrode 106. Also as shown in FIG. 5(A), part of the transparent electrode 104, and all of the lead wiring 105 and connecting electrode 106, are covered by the resin cured film pattern as the protective coat 122. Likewise, the transparent electrode 103 and the lead wiring 105 are electrically connected via a connecting electrode 106. As shown in FIG. 5(B), the transparent electrode 104 and the lead wiring 105 are electrically connected in a direct manner. The photosensitive resin composition and photosensitive element of the invention can be suitably used for formation of a resin cured film pattern as a protective coat in the structural section described above.

A method for manufacturing a touch panel according to this embodiment will now be explained. First, transparent electrodes (X-position coordinate) 103 are formed on a transparent electrode 101 provided on a base material 100. Next, transparent electrodes (Y-position coordinate) 104 are formed. Formation of the transparent electrodes 103 and transparent electrodes 104 may be accomplished by a method of etching a transparent electrode layer formed on the transparent base material 100.

Next, on the surface of the transparent base 101 there are formed lead wirings 105 for connection to an external circuit and connecting electrodes 106 connecting the lead wirings with the transparent electrodes 103 and transparent electrodes 104. The lead wirings 105 and connecting electrodes 106 may be formed after formation of the transparent electrodes 103 and transparent electrodes 104, or they may be formed simultaneously during formation of the respective transparent electrodes. Formation of the lead wirings 105 and connecting electrodes 106 may involve metal sputtering followed by etching or the like. The lead wirings 105 can be formed simultaneously with formation of the connecting electrodes 106, for example, using a conductive paste material containing silver flakes, by screen printing or the like. Next, connecting terminals 107 are formed for connection between the lead wirings 105 and an external circuit.

In order to cover the transparent electrodes 103 and transparent electrodes 104, the lead wirings 105, the connecting electrodes 106 and the connecting terminals 107 formed by this step, the photosensitive element 1 of this embodiment is contact bonded and a photosensitive layer 20 is provided over the electrodes. Next, the transferred photosensitive layer 20 is exposed to active light rays L in a pattern through a photomask having a prescribed shape. After irradiation of the active light rays L, development is performed and all but the prescribed sections of the photosensitive layer 20 are removed, to form a protective coat 122 composed of the cured sections of the photosensitive layer 20. It is possible in this manner to produce a touch panel provided with a protective coat 122.

EXAMPLES

The present invention will now be explained in greater detail by examples. However, the present invention is not limited to the examples described below.

[Preparation of Binder Polymer Solution (A1)]

In a flask equipped with a stirrer, a reflux condenser, an inert gas inlet and a thermometer there was charged component (1) listed in Table 1, the temperature was raised to 80° C. under a nitrogen gas atmosphere, and component (2) listed in Table 1 was added dropwise uniformly over a period of 4 hours while maintaining a reaction temperature of 80° C.±2° C. After the dropwise addition of component (2), stirring was continued at 80° C.±2° C. for 6 hours, to obtain a solution of a binder polymer with a weight-average molecular weight of approximately 80,000 (45 mass % solid) (A1).

TABLE 1

|  |  | Content (parts by mass) (A1) |
|---|---|---|
| (1) | Propyleneglycol monomethyl ether | 62 |
|  | Toluene | 62 |
| (2) | Methacrylic acid | 12 |
|  | Methyl methacrylate | 58 |
|  | Ethyl acrylate | 30 |
|  | 2,2'-Azobis (isobutyronitrile) | 1.2 |

The weight-average molecular weight (Mw) was measured by gel permeation chromatography (GPC), and calculation was performed using a standard polystyrene calibration curve. The GPC conditions were as follows.

GPC Conditions
Pump: Hitachi L-6000 (product name of Hitachi, Ltd.).
Column: Gelpack GL-R420, Gelpack GL-R430, Gelpack GL-R440 (all product names of Hitachi Chemical Co., Ltd.).
Eluent: Tetrahydrofuran
Measuring temperature: 40° C.
Flow rate: 2.05 mL/min
Detector: Hitachi L-3300 RI (product name of Hitachi, Ltd.).

[Acid Value Measuring Method]

The acid value was measured in the following manner. First, a binder polymer solution was heated at 130° C. for 1 hour to remove the volatile components and obtain a solid portion. After then precisely weighing out 1 g of polymer whose acid value was to be measured, 30 g of acetone was added to the polymer to form a homogeneous solution. Next, an appropriate amount of phenolphthalein was added to the solution as an indicator, and a 0.1N KOH aqueous solution was used for titration. The acid value was then calculated by the following formula.

Acid value=0.1×$Vf$×56.1/($Wp$×$I$/100)

In the formula, Vf represents the titer (mL) of the KOH aqueous solution, Wp represents the weight (g) of the measured resin solution, and I represents the ratio (mass %) of nonvolatile components in the measured resin solution.

Example 1

Preparation of Coating Solution (V-1) Containing Photosensitive Resin Composition The materials listed in Table 2 were mixed for 15 minutes using a stirrer, to prepare a coating solution (V-1) containing a photosensitive resin composition for formation of a protective coat.

TABLE 2

|  |  | Example | | | | |
|---|---|---|---|---|---|---|
|  |  | 1 | 2 | 3 | 4 | 5 |
| Component (A) | (A1) | 60*[1] | 60*[1] | 60*[1] | 60*[1] | 60*[1] |
| Component (B) | PET-30 | 40 | 40 | 40 | 40 | 40 |
| Component (C) | IRGACURE OXE 01 | 5 | — | 1 | 1 | 3 |
|  | IRGACURE OXE 02 | — | 1 | — | — | — |
|  | LUCIRIN TPO | — | — | — | — | 5 |
| Other photopolymerizable compound | IRGACURE 184 | — | — | — | — | — |
|  | IRGACURE 651 | — | — | — | — | — |
|  | IRGACURE 369 | — | — | — | — | — |
|  | IRGACURE 907 | — | — | — | — | — |
|  | N-1717 | — | — | — | — | — |
|  | EAB | — | — | — | — | — |
| Component (D) | SB501 | — | — | 5 | — | — |
|  | SB502 | — | — | — | 5 | — |

TABLE 2-continued

|  |  | Example | | | | |
|---|---|---|---|---|---|---|
|  |  | 1 | 2 | 3 | 4 | 5 |
| Other | Antage W-500 | 0.1 | 0.1 | 0.1 | 0.1 | 0.1 |
|  | SH30 | 0.1 | 0.1 | 0.1 | 0.1 | 0.1 |
|  | Methyl ethyl ketone | 50 | 50 | 50 | 50 | 50 |

*[1]Indicates parts by mass of binder polymer after removal of solvent.

[Fabrication of Photosensitive Element (E-1)]

Using a polyethylene terephthalate film with a thickness of 50 μm as the support film, the coating solution (V-1) containing the photosensitive resin composition prepared above was uniformly coated onto the support film with a comma coater, and dried for 3 minutes at 100° C. with a hot air convection drier to remove the solvent, thereby forming a photosensitive layer comprising the photosensitive resin composition (photosensitive resin composition layer). The thickness of the obtained photosensitive layer was 2.5 μm.

Next, a 25 μm-thick polyethylene film was attached as a cover film on the obtained photosensitive layer, to fabricate a photosensitive element (E-1) for formation of a protective coat.

[Measurement of Cured Film Transmittance]

While releasing the polyethylene film as the cover film of the obtained photosensitive element (E-1), a laminator (trade name HLM-3000 by Hitachi Chemical Co., Ltd.) was used for lamination on a 1 mm-thick glass panel with the photosensitive layer in contact therewith, under conditions with a roll temperature of 120° C., a substrate feed rate of 1 m/min and a contact bonding pressure (cylinder pressure) of $4 \times 10^5$ Pa (because a substrate with a thickness of 1 mm and 10 cm length×10 cm width was used, the linear pressure at this time was $9.8 \times 10^3$ N/m), to form a stack with the photosensitive layer and support film laminated on the glass panel.

Next, a parallel ray exposure device (EXM1201 by Orc Manufacturing Co., Ltd.) was used to expose the photosensitive layer of the obtained stack to ultraviolet rays with an exposure dose of $5 \times 10^2$ J/m² (measured value for i-rays (wavelength of 365 nm)) from the photosensitive layer side, and then the support film was removed to obtain a transmittance measuring sample having a cured film pattern of a photosensitive layer with a thickness of 2.5 μm.

Next, the visible light transmittance of the obtained sample at a measuring wavelength range of 400 to 700 nm was measured using an ultraviolet and visible spectrophotometer (U-3310) by Hitachi High-Technologies Corp. The transmittance of the obtained cured film was 97% at a wavelength of 700 nm, 96% at a wavelength of 550 nm and 94% at a wavelength of 400 nm, and the minimum transmittance at 400 to 700 nm was 94%, and therefore satisfactory transmittance was ensured.

[Measurement of b* Value of Cured Film]

While releasing the polyethylene film of the obtained photosensitive element (E-1), a laminator (trade name HLM-3000 by Hitachi Chemical Co., Ltd.) was used for lamination on a 0.7 mm-thick glass panel with the photosensitive layer in contact therewith, under conditions with a roll temperature of 120° C., a substrate feed rate of 1 m/min and a contact bonding pressure (cylinder pressure) of $4 \times 10^5$ Pa (because a substrate with a thickness of 1 mm and 10 cm length×10 cm width was used, the linear pressure at this time was $9.8 \times 10^3$ N/m), to form a substrate with the photosensitive layer and support film laminated on the glass panel.

Next, a parallel ray exposure device (EXM1201 by Orc Manufacturing Co., Ltd.) was used to expose the obtained photosensitive layer to ultraviolet rays with an exposure dose of $5 \times 10^2$ J/m² (measured value for i-rays (wavelength of 365 nm)) from the photosensitive layer side, and then the support film was removed and ultraviolet rays were further irradiated at an exposure dose of $1 \times 10^4$ J/m² (measured value for i-rays (wavelength of 365 nm)) from the photosensitive layer side, to obtain a b* value measuring sample having a cured film pattern of the photosensitive layer with a thickness of 2.5 μm.

The obtained sample was then used for measurement of the b* value based on the CIELAB color system, using a spectrocolorimeter (CM-5) by Konica Minolta Holdings, Inc., with the light source set to D65 and the viewing angle to 2°.

The b* value of the cured film was 0.45, thus confirming that it had a satisfactory b* value.

[Measurement of Photosensitive Layer Absorbance]

A UV spectrophotometer (U-3310 spectrophotometer by Hitachi High-Technologies Corp.) was used for the measurement. The measurement was carried out by placing the photosensitive element on the measuring side, placing the support film on the reference side, and conducting continuous measurement in absorbance mode up to 300 to 700 nm, and reading off the values for 334 nm and 365 nm.

The obtained absorbance values were 0.44 at 334 nm and 0.14 at 365 nm.

[Photosensitive Property of Photosensitive Layer]

While releasing the polyethylene film of the obtained photosensitive element, it was laminated on a PET film [thickness: 125 μm, trade name A4300 by Toyobo, Ltd.] using a laminator (trade name: Model HLM-3000 by Hitachi Chemical Co., Ltd.), under conditions with a roll temperature of 120° C., a substrate feed rate of 1 m/min and a contact bonding pressure (cylinder pressure) of $4 \times 10^5$ Pa. The active light irradiation was performed by placement on the Mylar PET of an exposure device with an EXM-1201 high-pressure mercury lamp (product of Orc Manufacturing Co., Ltd.) and irradiating it with a prescribed dose of active light rays through the filter. Following active light ray irradiation it was allowed to stand at room temperature for 10 minutes, and then the polyethylene terephthalate was removed and the photosensitive resin composition at the sections that had not been exposed to active light rays were subjected to spray development for 60 seconds with 1% aqueous sodium carbonate at 30° C. Following spray development, an ultraviolet irradiation device by Orc Manufacturing Co., Ltd. was used for ultraviolet irradiation at 1 J/cm². The evaluation sensitivity was the necessary exposure dose to obtain 6/21 steps with a 41-step tablet by Hitachi Chemical Co., Ltd. Also, a PET photomask having a wiring pattern with a line width/space width ratio of 6/6 to 47/47 (unit: μm) was firmly attached, the pattern of the exposure dose obtained with 6/21 steps was observed with an optical microscope and the resolution (m) was determined from the line width (μm) remaining as a line-and-space pattern.

Examples 2 to 5, Comparative Examples 1 to 6

Photosensitive elements were fabricated in the same manner as Example 1 except for using coating solutions comprising the photosensitive resin compositions listed in Table 2 and Table 3, and the transmittance measurement, b* values, absorbances and photosensitive properties were evaluated. The numerical values in Table 2 and Table 3 represent parts by mass.

TABLE 3

| | | Comp. Ex. | | | | | |
|---|---|---|---|---|---|---|---|
| | | 1 | 2 | 3 | 4 | 5 | 6 |
| Component (A) | (A1) | 60*¹ | 60*¹ | 60*¹ | 60*¹ | 60*¹ | 60*¹ |
| Component (B) | PET-30 | 40 | 40 | 40 | 40 | 40 | 40 |
| Component (C) | IRGACURE OXE 01 | — | — | — | — | — | — |
| | IRGACURE OXE 02 | — | — | — | — | — | — |
| | LUCIRIN TPO | — | — | — | — | — | — |
| Other photopolymerizable compound | IRGACURE 184 | 5 | — | — | — | — | — |
| | IRGACURE 651 | — | 5 | — | — | — | — |
| | IRGACURE 369 | — | — | — | — | 3 | — |
| | IRGACURE 907 | — | — | — | — | — | 3 |
| | N-1717 | — | — | 0.2 | 0.2 | — | — |
| | EAB | — | — | 1 | 2 | — | — |
| Component (D) | SB501 | — | — | — | — | — | — |
| | SB502 | — | — | — | — | — | — |
| Other | Antage W-500 | 0.1 | 0.1 | 0.1 | 0.1 | 0.1 | 0.1 |
| | SH30 | 0.1 | 0.1 | 0.1 | 0.1 | 0.1 | 0.1 |
| | Methyl ethyl ketone | 50 | 50 | 50 | 50 | 50 | 50 |

*¹Indicates parts by mass of binder polymer after removal of solvent.

The symbols for the components in Table 2 and Table 3 have the following meanings.
Component (A)
(A1): Propyleneglycol monomethyl ether/toluene solution of copolymer with monomer mixing ratio of (methacrylic acid/methyl methacrylate/ethyl acrylate=12/58/30 (mass ratio)), weight-average molecular weight: 65,000, acid value: 78 mgKOH/g
Component (B)
PET-30: Pentaerythritol triacrylate (product of Nippon Kayaku Co., Ltd.)
Component (C)
IRGACURE OXE 01: 1,2-Octanedione,1-[(4-phenylthio)phenyl-,2-(O-benzoyloxime)] (product of BASF)
IRGACURE OXE 02: Ethanone,1-[9-ethyl-6-(2-methylbenzoyl)-9H-carbazol-3-yl]-,1-(O-acetyloxime) (product of BASF)
LUCIRIN TPO: 2,4,6-Trimethylbenzoyl-diphenyl-phosphine oxide (product of BASF)
Other Photopolymerization Initiators
IRGACURE 184: 1-Hydroxy-cyclohexyl-phenyl-ketone (product of BASF)
IRGACURE 651: 2,2-Dimethoxy-1,2-diphenylethan-1-one (product of BASF)
IRGACURE 369: 2-Benzyl-2-dimethylamino-1-(morpholinophenyl)-butanone-1 (product of BASF)
IRGACURE 907: 2-Methyl-1-[4-(methylthio)phenyl]-2-morpholinopropan-1-one (product of BASF)
N-1717: 1,7-bis(9-Acridinyl)heptane (product of Adeka Corp.)
EAB: 4,4'-bis(Diethylamino)benzophenone (product of Hodogaya Chemical Co., Ltd.)
Component (D)
SB501: Ethyl-2-cyano-3,3-diphenyl acrylate (product of Shipro Kasei Co., Ltd.)
SB502: 2'-Ethylhexyl-2-cyano-3,3-diphenyl acrylate (product of Shipro Kasei Co., Ltd.)
Other Components
Antage W-500: 2,2'-Methylene-bis(4-ethyl-6-tert-butylphenol) (product of Kawaguchi Chemical Industry Co., Ltd.)
SH30: Octamethylcyclotetrasiloxane (product of Dow Corning Toray)
Methyl ethyl ketone: product of Tonen Chemical Co., Ltd.

As shown in Table 4 and Table 6, it was possible to achieve both resolution and transparency with a film thickness of 2.5 μm, in Examples 1, 2 and 5 which used an oxime ester compound or phosphine oxide compound as the photopolymerization initiator. Furthermore, it was possible to obtain even higher resolution in Examples 3 and 4 which also employed an ultraviolet absorber. However, the reduction in resolution was considerable in Comparative Examples 1 to 6. Also, Comparative Examples 3 and 4 had satisfactory resolution but exhibited yellow coloration of the film.

Examples 6 to 10 and Comparative Examples 5 to 12

The same evaluation was conducted with a photosensitive layer film thickness of 5 μm for Examples 1 to 5 and Comparative Examples 1 to 6 (Examples 6 to 10 and Comparative Examples 5 to 12). Here, however, the necessary exposure dose for [Photosensitive property of photosensitive layer] was the exposure dose to obtain 10/41 steps with a 41-step tablet by Hitachi Chemical Co., Ltd. The results are shown in Table 5 and Table 7 below.

TABLE 4

|  | Example 1 | Example 2 | Example 3 | Example 4 | Example 5 |
| --- | --- | --- | --- | --- | --- |
| Film thickness (μm) | 2.5 | 2.5 | 2.5 | 2.5 | 2.5 |
| Transmittance (%) 700 nm | 99 | 99 | 99 | 99 | 99 |
| 550 nm | 99 | 99 | 99 | 99 | 99 |
| 400 nm | 94 | 93 | 97 | 97 | 95 |
| Minimum transmittance at 400-700 nm (%) | 94 | 93 | 95 | 95 | 95 |
| Absorbance 334 nm | 0.44 | 0.42 | 0.70 | 0.70 | 0.45 |
| 365 nm | 0.14 | 0.12 | 0.11 | 0.12 | 0.20 |
| b* | 0.45 | 0.60 | 0.28 | 0.28 | 0.22 |
| Sensitivity (mJ/cm$^2$) | 5 | 5 | 40 | 40 | 80 |
| Resolution (x/x, μm) | 25 | 30 | 22 | 22 | 25 |
| Resolution (x/400, μm) | 15 | 15 | 15 | 15 | 15 |
| Resolution (400/x, μm) | 30 | 45 | 25 | 25 | 30 |
| Color | Colorless, transparent | Colorless, transparent | Colorless, transparent | Colorless, transparent | Colorless, transparent |

TABLE 5

|  | Example 6 | Example 7 | Example 8 | Example 9 | Example 10 |
| --- | --- | --- | --- | --- | --- |
| Film thickness (μm) | 5 | 5 | 5 | 5 | 5 |
| Transmittance (%) 700 nm | 98 | 98 | 98 | 98 | 98 |
| 550 nm | 98 | 98 | 98 | 98 | 98 |
| 400 nm | 88 | 86 | 94 | 94 | 90 |
| Minimum transmittance at 400-700 nm (%) | 88 | 86 | 90 | 90 | 90 |
| Absorbance 334 nm | 0.90 | 0.86 | 1.42 | 1.40 | 0.88 |
| 365 nm | 0.29 | 0.25 | 0.22 | 0.24 | 0.38 |
| b* | 0.92 | 0.98 | 0.58 | 0.56 | 0.42 |
| Sensitivity (mJ/cm$^2$) | 15 | 15 | 120 | 120 | 240 |
| Resolution (x/x, μm) | 30 | 35 | 27 | 27 | 30 |
| Resolution (x/400, μm) | 20 | 20 | 20 | 20 | 20 |
| Resolution (400/x, μm) | 30 | 45 | 25 | 25 | 30 |
| Color | Colorless, transparent | Colorless, transparent | Colorless, transparent | Colorless, transparent | Colorless, transparent |

TABLE 6

|  | Comp. Ex. 1 | Comp. Ex. 2 | Comp. Ex. 3 | Comp. Ex. 4 | Comp. Ex. 5 | Comp. Ex. 6 |
| --- | --- | --- | --- | --- | --- | --- |
| Film thickness (μm) | 2.5 | 2.5 | 2.5 | 2.5 | 2.5 | 2.5 |
| Transmittance (%) 700 nm | 99 | 94 | 99 | 99 | 99 | 99 |
| 550 nm | 99 | 93 | 98 | 99 | 99 | 99 |
| 400 nm | 99 | 95 | 85 | 80 | 90 | 95 |
| Minimum transmittance at 400-700 nm (%) | 95 | 95 | 85 | 80 | 90 | 95 |
| Absorbance 334 nm | 0.01 | 0.01 | 0.90 | 1.54 | 1.60 | 0.36 |
| 365 nm | 0.03 | 0.03 | 0.61 | 2.62 | 0.45 | 0.06 |
| b* | 0.22 | 0.25 | 4.20 | 7.00 | 0.5 | 0.28 |
| Sensitivity (mJ/cm$^2$) | 540 | 170 | 70 | 90 | 15 | 30 |
| Resolution (x/x, μm) | 40 | 35 | 25 | 25 | 40 | >47 |
| Resolution (x/400, μm) | 40 | 25 | 8 | 12 | 35 | >47 |
| Resolution (400/x, μm) | >47 | >47 | 32 | 30 | >47 | >47 |
| Color | Colorless, transparent | Colorless, transparent | Yellow, transparent | Yellow, transparent | Colorless, transparent | Colorless, transparent |

TABLE 7

|  | Comp. Ex. 7 | Comp. Ex. 8 | Comp. Ex. 9 | Comp. Ex. 10 | Comp. Ex. 11 | Comp. Ex. 12 |
| --- | --- | --- | --- | --- | --- | --- |
| Film thickness (μm) | 5 | 5 | 5 | 5 | 5 | 5 |
| Transmittance (%) 700 nm | 98 | 88 | 98 | 98 | 98 | 98 |
| 550 nm | 98 | 86 | 98 | 98 | 96 | 98 |
| 400 nm | 98 | 90 | 81 | 90 | 72 | 64 |

TABLE 7-continued

|  | Comp. Ex. 7 | Comp. Ex. 8 | Comp. Ex. 9 | Comp. Ex. 10 | Comp. Ex. 11 | Comp. Ex. 12 |
| --- | --- | --- | --- | --- | --- | --- |
| Minimum transmittance at 400-700 nm (%) | 90 | 90 | 81 | 90 | 72 | 64 |
| Absorbance 334 nm | 0.02 | 0.02 | 3.10 | 0.71 | 1.90 | 3.00 |
| 365 nm | 0.06 | 0.06 | 0.66 | 0.12 | 1.25 | 5.24 |
| b* | 0.44 | 0.5 | 1.1 | 0.56 | 8.6 | 14 |
| Sensitivity (mJ/cm$^2$) | >500 | >500 | 45 | 90 | 210 | 270 |
| Resolution (x/x, μm) | >47 | >47 | 45 | >47 | 30 | 30 |
| Resolution (x/400, μm) | >47 | >47 | 40 | >47 | 15 | 18 |
| Resolution (400/x, μm) | >47 | >47 | >47 | >47 | 32 | 30 |
| Color | Colorless, transparent | Colorless, transparent | Colorless, transparent | Colorless, transparent | Yellow, transparent | Yellow, transparent |

EXPLANATION OF SYMBOLS

1: Photosensitive element, 10: support film, 20: photosensitive layer, 22: protective coat, 30: protective film, 100: base material, 101: transparent base, 102: touch screen, 103: transparent electrode (X-position coordinate), 104: transparent electrode (Y-position coordinate), 105: lead wiring, 106: connecting electrode, 107: connecting terminal, 110,120: electrodes for touch panel, 122,123: protective coats, 130: photomask, 200: touch panel.

The invention claimed is:

1. A touch panel comprising a base material including a transparent electrode in a sensing region of the touch panel or a metal layer in a frame region of the touch panel, and a resin cured film pattern formed on the transparent electrode or the metal layer of the base material, the resin cured film pattern being formed by irradiating prescribed sections of a film including a photosensitive resin composition with light, and then developing the film to remove a part of the film other than the prescribed sections, the photosensitive resin composition comprising a binder polymer, a photopolymerizable compound, and a photopolymerization initiator, the photosensitive resin composition comprising no pigment, the photopolymerization initiator including at least one selected from the group comprising 1,2-octanedione,1-[4-(phenylthio)phenyl-,2-(O-benzoyloxime)]; ethanone,1-[9-ethyl-6-(2-methylbenzoyl)-9H-carbazol-3-yl]-,1-(O-acetyloxime); and 2,4,6-trimethylbenzoyl-diphenyl-phosphine oxide, wherein the photopolymerizable compound comprises one or more selected from among (meth)acrylate compounds having a pentaerythritol-derived backbone, (meth)acrylate compounds having a dipentaerythritol-derived backbone and (meth)acrylate compounds having a trimethylolpropane-derived backbone, the content of the photopolymerization initiator is 0.1 to 20 parts by mass with respect to 100 parts by mass as the total of the binder polymer and the photopolymerizable compound, and the thickness of the resin cured film pattern is 2 to 8 μm.

2. A method of manufacturing a touch panel comprising a base material including a transparent electrode in a sensing region of the touch panel or a metal layer in a frame region of the touch panel, and a resin cured film pattern on the transparent electrode or the metal layer of the base material, the method comprising:

applying a photosensitive layer to the base material, the photosensitive layer comprising a photosensitive resin composition, the photosensitive resin composition comprising a binder polymer, a photopolymerizable compound, and a photopolymerization initiator, the photosensitive resin composition comprising no pigment, the photopolymerization initiator including at least one selected from the group comprising 1,2-octanedione,1-[4-(phenylthio)phenyl-,2-(O-benzoyloxime)]; ethanone,1-[9-ethyl-6-(2-methylbenzoyl)-9H-carbazol-3-yl]-,1-(O-acetyloxime); and 2,4,6-trimethylbenzoyl-diphenyl-phosphine oxide, irradiating prescribed portions of the photosensitive layer with light, and developing the layer to remove a part of the layer other than the prescribed sections, in order to form the resin cured film pattern, wherein the photopolymerizable compound comprises one or more selected from among (meth)acrylate compounds having a pentaerythritol-derived backbone, (meth)acrylate compounds having a dipentaerythritol-derived backbone and (meth)acrylate compounds having a trimethylolpropane-derived backbone, the content of the photopolymerization initiator is 0.1 to 20 parts by mass with respect to 100 parts by mass as the total of the binder polymer and the photopolymerizable compound; and the thickness of the resin cured film pattern is 2 to 8 μm.

3. A touch panel comprising a touch sensor and a resin cured film pattern formed on the touch sensor, the resin cured film pattern being formed by irradiating prescribed sections of a film including a photosensitive resin composition with light, and then developing the film to remove a part of the film other than the prescribed sections, the photosensitive resin composition comprising a binder polymer, a photopolymerizable compound, and a photopolymerization initiator, the photosensitive resin composition comprising no pigment, the photopolymerization initiator including at least one selected from the group comprising 1,2-octanedione,1-[4-(phenylthio)phenyl-,2-(O-benzoyloxime)]; ethanone,1-[9-ethyl-6-(2-methylbenzoyl)-9H-carbazol-3-yl]-,1-(O-acetyloxime); and 2,4,6-trimethylbenzoyl-diphenyl-phosphine oxide, wherein the photopolymerizable compound comprises one or more selected from among (meth)acrylate compounds having a pentaerythritol-derived backbone, (meth)acrylate compounds having a dipentaerythritol-derived backbone and (meth)acrylate compounds having a trimethylolpropane-derived backbone, the content of the photopolymerization initiator is 0.1 to 20 parts by mass with respect to 100 parts by mass as the total of the binder polymer and the photopolymerizable compound, and the thickness of the resin cured film pattern is 2 to 8 μm.

4. The touch panel according to claim 1, wherein the content of the photopolymerization initiator is 0.1 to 10 parts by mass with respect to 100 parts by mass as the total of the binder polymer and the photopolymerizable compound, the photopolymerizable compound comprises (meth)acrylate compounds having a pentaerythritol-derived backbone

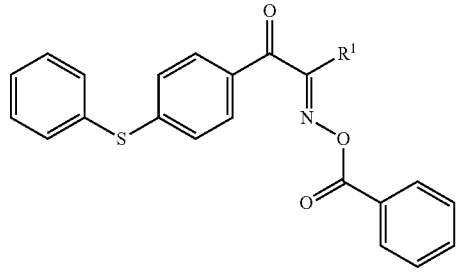
(C-1)

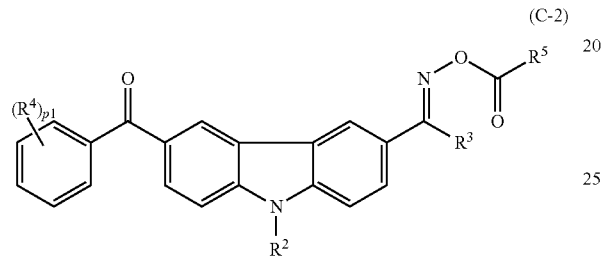
(C-2)

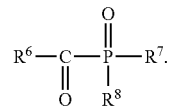
(C-3)

5. The method according to claim 2, wherein the content of the photopolymerization initiator is 0.1 to 10 parts by mass with respect to 100 parts by mass as the total of the binder polymer and the photopolymerizable compound, the photopolymerizable compound comprises (meth)acrylate compounds having a pentaerythritol-derived backbone

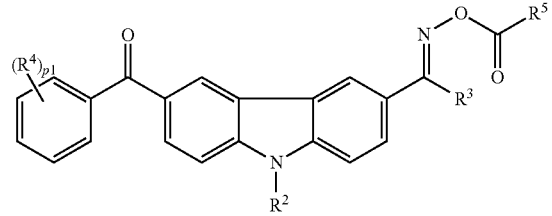
(C-1)

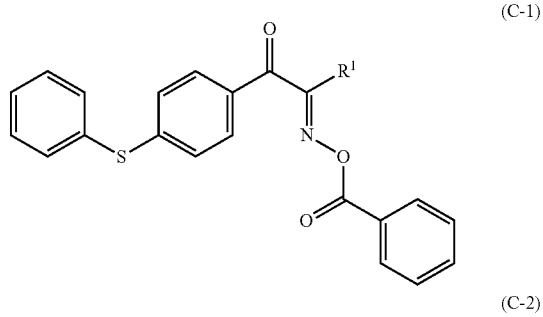
(C-2)

6. The touch panel according to claim 3, wherein the content of the photopolymerization initiator is 0.1 to 10 parts by mass with respect to 100 parts by mass as the total of the binder polymer and the photopolymerizable compound, the photopolymerizable compound comprises (meth)acrylate compounds having a pentaerythritol-derived backbone

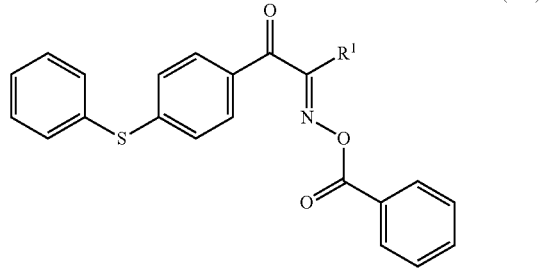
(C-1)

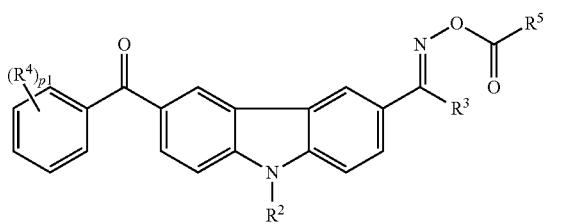
(C-2)

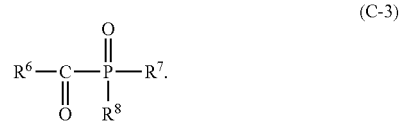
(C-3)

7. A touch panel comprising a base material, a transparent electrode provided on the base material in a sensing region of the touch panel, a metal layer provided on the base material in a frame region of the touch panel, and a resin cured film pattern formed on at least one of the transparent electrode and the metal layer, the resin cured film pattern being formed by irradiating prescribed sections of a film including a photosensitive resin composition with light, and then developing the film to remove a part of the film other than the prescribed sections, the photosensitive resin composition comprising a binder polymer, a photopolymerizable compound, and a photopolymerization initiator, the photosensitive resin composition comprising no pigment, the photopolymerization initiator including at least one selected from the group comprising 1,2-octanedione,1-[4-(phenylthio)phenyl-,2-(O-benzoyloxime)]; ethanone,1-[9-ethyl-6-(2-methylbenzoyl)-9H-carbazol-3-yl]-,1-(O-acetyloxime); and 2,4,6-trimethylbenzoyl-diphenyl-phosphine oxide, wherein the photopolymerizable compound comprises one or more selected from among (meth)acrylate compounds having a pentaerythritol-derived backbone, (meth)acrylate compounds having a dipentaerythritol-derived backbone and (meth)acrylate compounds having a trimethylolpropane-derived backbone, the content of the photopolymerization initiator is 0.1 to 20 parts by mass with respect to 100 parts by mass as the total of the binder polymer and the photopolymerizable compound, and the thickness of the resin cured film pattern is 2 to 8 µm.

8. The touch panel according to claim 7, wherein the content of the photopolymerization initiator is 0.1 to 10 parts by mass with respect to 100 parts by mass as the total of the binder polymer and the photopolymerizable compound, the photopolymerizable compound comprises (meth)acrylate compounds having a pentaerythritol-derived backbone

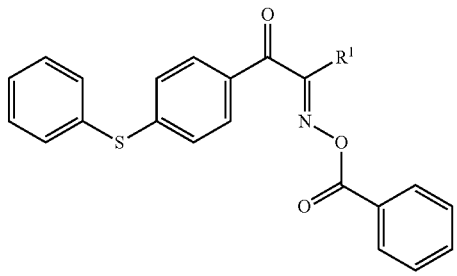
(C-1)

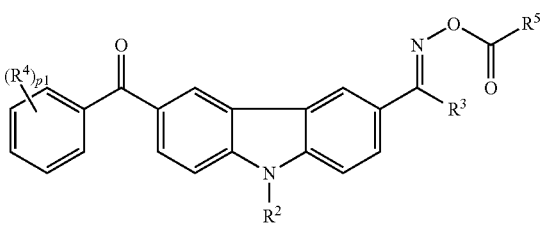
(C-2)

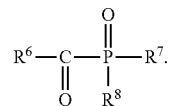
(C-3)

\* \* \* \* \*